(12) United States Patent
Tonami et al.

(10) Patent No.: US 10,036,815 B2
(45) Date of Patent: Jul. 31, 2018

(54) RADIATION DETECTOR, AND METHOD FOR PRODUCING THE SAME

(71) Applicant: Shimadzu Corporation, Kyoto-shi (JP)

(72) Inventors: Hiromichi Tonami, Otokuni-gun (JP); Tomoaki Tsuda, Kyoto (JP)

(73) Assignee: Shimadzu Corporation, Nakagyo-ku, Kyoto-shi, Kyoto (JP)

( * ) Notice: Subject to any disclaimer, the term of this patent is extended or adjusted under 35 U.S.C. 154(b) by 0 days.

(21) Appl. No.: 15/027,962

(22) PCT Filed: Jul. 29, 2014

(86) PCT No.: PCT/JP2014/069979
§ 371 (c)(1),
(2) Date: Apr. 7, 2016

(87) PCT Pub. No.: WO2015/052977
PCT Pub. Date: Apr. 16, 2015

(65) Prior Publication Data
US 2016/0282484 A1    Sep. 29, 2016

(30) Foreign Application Priority Data
Oct. 7, 2013 (JP) ................................ 2013-210166

(51) Int. Cl.
*G01T 1/20* (2006.01)
*H01L 27/146* (2006.01)

(52) U.S. Cl.
CPC .......... *G01T 1/2018* (2013.01); *G01T 1/2002* (2013.01); *H01L 27/14625* (2013.01);
(Continued)

(58) Field of Classification Search
None
See application file for complete search history.

(56) References Cited

U.S. PATENT DOCUMENTS

| | | | |
|---|---|---|---|
| 2004/0262527 A1* | 12/2004 | Ooi | ........... G01T 1/1644 250/368 |
| 2006/0192128 A1* | 8/2006 | Benlloch Bavciera | ........... G01T 1/1642 250/369 |
| 2011/0056618 A1 | 3/2011 | Tonami | |

FOREIGN PATENT DOCUMENTS

| | | |
|---|---|---|
| JP | 2005-37363 A | 2/2005 |
| JP | 2008-281442 A | 11/2008 |
| WO | WO 2009/147739 A1 | 12/2009 |

OTHER PUBLICATIONS

International Search Report for PCT/JP2014/069979.
(Continued)

*Primary Examiner* — Edwin Gunberg
(74) *Attorney, Agent, or Firm* — Muir Patent Law, PLLC

(57) ABSTRACT

In this radiation detector, a scintillator block (3) and a light guide (5) are optically coupled such that surfaces of side peripheral portions (25) face surfaces of scintillator crystals, among scintillator crystals configuring the scintillator block (3), which are positioned at side edge portions. Accordingly, scintillator light generated at the side edge portions of the scintillator block (3) becomes incident on the side peripheral portions (25) more reliably. As a result, a radiation detector (1) according to the present invention is capable of achieving high resolution in DOI detection. Furthermore, resin curing is used to integrally form the side peripheral portions (25) comprising a plurality of blocks, and thus a complex assembly step during production of the light guide (5) does not need to be performed. Accordingly, production of the light guide (5) is facilitated, and thus low production costs of the radiation detector according to the present invention can be achieved.

23 Claims, 18 Drawing Sheets

(52) U.S. Cl.
CPC .. *H01L 27/14629* (2013.01); *H01L 27/14663* (2013.01); *H01L 27/14685* (2013.01)

(56) References Cited

OTHER PUBLICATIONS

Mintzer et al. "Design and Performance of a New Pixelated-LSO/PSPMT Gamma-Ray Detector for High Resolution PET Imaging," 2007 IEEE Nuclear Science Symposium Conference Record, 2007, vol. 5, p. 3418-3422.

\* cited by examiner

RADIATION DETECTOR, AND METHOD FOR PRODUCING THE SAME

TECHNICAL FIELD

The present invention relates to a radiation detector in which a scintillator, a light guide, and a light receiving element are optically coupled in this order, and also relates to a method for producing the radiation detector.

BACKGROUND ART

In a medical field, a radiation tomographic apparatus (ECT: Emission Computed Tomography) is used, in which radiation emitted from a radioactive drug administered in a subject and localized in a region of interest is detected, and the tomographic image of the radioactive drug distribution in the region of interest in the subject is obtained. As such popular ECTs, a PET (Position Emission Tomography) apparatus and a SPECT (Single Photon Emission Computed Tomography) apparatus are known.

As an example, a PET apparatus will be described below. A PET apparatus is an apparatus configured to form a PET image showing a distribution of radioactive drug labeled with positron-emitting nuclides in the subject. As shown in FIG. 16, the PET apparatus 51 is provided with a plurality of radiation detectors 53 arranged so as to surround the subject M in a ring-shape. The radioactive drug administered to the subject is accumulated in a region of interest, and positrons are emitted from the accumulated drug. The emitted positron causes an annihilation with an electron, resulting in release of two γrays (gamma rays), i.e., a γ-ray N1 (gamma ray N1) and a γ-ray N2 (gamma ray N2), for one positron. Since the γ-ray N1 (gamma ray N1) and the γ-ray N2 (gamma ray N2) have momentum opposite with each other, they are emitted in opposite directions and simultaneously detected by the respective radiation detectors 53.

Based on the positional information of the detected γ-rays, the position where the annihilation occurred, i.e., the position of the radioactive drug, is calculated and accumulated as positional information. Then, based on the accumulated positional information, an image showing the distribution of the radioactive drug in the region of interest is provided by the PET apparatus (See, e.g., Patent Document 1 and Non-patent Document 2).

In recent years, besides the PET apparatus, a TOF-PET (TOF: Time of Flight) apparatus has been used to perform diagnosis. In the TOF-PET apparatus, by measuring the difference of flight times of two γ-rays (gamma rays) from the radiation position to the detection position by both the radiation detectors, the generation position of the γ-rays (gamma rays) is identified. Since the TOF-PET apparatus uses the information on the time difference, the apparatus can obtain a distribution image of the radioactive drug having less noise than a normal PET apparatus.

In some cases, as a radiation detector used in such PET apparatus, a radiation detector having a structure capable of performing a depth position discrimination of the scintillator provided therein is mounted (see Patent Documents 2 and 3). FIG. 17 is a perspective view showing a structure of a conventional radiation detector. In this conventional radiation detector 100, a scintillator block 101, a light guide 103, and a solid state light detector 105 are laminated in this order.

The scintillator block 101 is constituted by scintillator crystal layers 101a, 101b, 101c, and 101d each formed by two-dimensionally integrating rectangular parallelepiped scintillator crystals. The scintillator crystal layers 101a, 101b, 101c, and 101d are laminated in the z-direction, i.e., in the depth direction of the scintillator block 101, and configured to emit light by absorbing γ-ray (gamma rays) emitted from a subject. The light emitted in the scintillator block 101 will be referred to as "scintillator light".

The light guide 103 is optically coupled to the scintillator block 101 and the solid state light detector 105 and transmits the scintillator light to the solid state light detector 105. The solid state light detector 105 is made of, e.g., two-dimensionally arranged SiPM (Silicon Photo Multiplier) elements as examples of light receiving elements, and is configured to detect the scintillator light transmitted by the light guide 103 and convert the scintillator light into electrical signals. Based on the converted electrical signals, a tomographic image showing the distribution of the positron-emitting nuclides in a region of interest is acquired. With this structure, the light source position in the depth direction at which interaction occurred (DOI: Depth of Interaction) can be discriminated.

RELATED ART DOCUMENTS

Patent Documents

Patent Document 1: Japanese Translation of PCT International Application Publication No. JP-T-2008-525161
Patent Document 2: Japanese Unexamined Patent Application Publication No. 2004-279057
Patent Document 3: WO 2009/147739

Non-Patent Documents

Non-patent document 1: "Design and Performance of a New Pixelated-LSO/PSPMT Gamma-Ray Detector for High Resolution PET Imaging", Nuclear Science Symposium Conference Record, 2007. NSS '07. IEEE (Volume: 5)

SUMMARY OF THE INVENTION

Problems to be Solved by the Invention

However, in the case of the conventional example having the aforementioned structure, there are following drawbacks.

That is, in cases where a conventional radiation detector has a structure capable of performing a DOI detection, it is difficult to accurately discriminate the position of the scintillator light generated at the side edge portion of the scintillator block. In cases where the scintillator crystal generated the scintillator light is positioned at the center portion of the scintillator block 101, the scintillator light is incident to a light receiving section 107 of the solid state light detector 105 in an evenly spread manner. The incident scintillator light is detected by the solid state light detector 105 and converted into electrical signals.

On the other hand, a part of the scintillator light generated at the side edge portion of the scintillator block 101 is scattered or reflected by the outer wall of the scintillator block. Further, as shown in FIG. 18A, the light receiving section 107 of the solid state light detector 105 is not extended to the edge portion, resulting in no detection of the scintillator light at the edge portion of the solid state light detector. Therefore, the range of the light receiving section 107 capable of detecting scintillator light generated at the side edge portion of the scintillator block becomes much smaller. Further, the scintillator light incident to the light receiving section 107 becomes weak and uneven. As a result, due to the decrease in output, the incomplete gravity center calculation, etc., the resolution at the side edge portions deteriorates extremely. Especially, it is difficult to apply the conventional radiation detector to a TOF-PET apparatus requiring high resolution.

Further, in the conventional radiation detector 100, as shown in FIG. 18B, there is a case in which a reflector grating 109 is sealed inside the light guide 103. The reflector grating 109 has a structure in which plate-shaped light reflective members are combined in a lattice shape as shown in FIG. 18C. The height of the reflector grating 109 is adjusted to be the same height of the light guide 103. That is, the light guide 103 is partitioned into a plurality of light guide blocks 103a by the reflector grating 109.

In this case, to prevent output deterioration due to attenuation of the scintillator light, it is preferable to use an optical material excellent in transparency as the optical material constituting each light guide block 103a constituting the light guide 103. Among various optical materials, as one example of a material especially excellent in transparency, acrylic resin, silica glass, etc., can be exemplified. However, in the case of forming all of the light guide blocks 103a by acrylic resin, it is required to polish the light guide blocks 103a small in area one by one and then assemble so that the light guide blocks and the reflector grating are in contact with each other. This makes the work for bonding to and assembling with the reflector grating complicate and difficult, resulting in an increased production cost of the radiation detector.

The present invention was made in view of the aforementioned circumstances, and aims to provide a radiation detector having a structure capable of performing a DOI (Depth of Interaction) detection and capable of realizing high resolution at side edge portions at low cost, and also aims to provide a method for producing such a radiation detector.

Means for Solving the Problems

To attain the aforementioned objects, the present invention has the following structure.

That is, a radiation detector according to the present invention includes: a scintillator block constituted by block-shaped scintillator crystals arranged three-dimensionally, the scintillator block being configured to detect incident radiation and emit light; a light guide optically coupled to the scintillator block, the light guide being configured to transmit the light emitted from the scintillator; a solid state light detector optically coupled to the light guide, the solid state light detector being configured to convert the light transmitted from the light guide into electrical signals; and a reflector embedded in the light guide, the reflector being configured to reflect light. The light guide is structured so as to be divided into a center portion and side peripheral portions by the reflector, and the light guide and the scintillator block are coupled such that surfaces of the side peripheral portions face surfaces of the scintillator crystals positioned at side edge portions of the scintillator block among the scintillator crystals constituting the scintillator block.

[Functions and Effects]

According to the radiation detector of the present invention, the light guide is partitioned into a center portion and side peripheral portions by the reflector. Further, the side peripheral portions are optically coupled to the scintillator crystals positioned at the side edge portions among the scintillator crystals constituting the scintillator block so that the surfaces of the side peripheral portions face the surfaces of the scintillator crystals.

The scintillator light generated at the side edge portion of the scintillator block is more assuredly incident to the side peripheral portion, and therefore the resolution of the radiation image based on the scintillator light generated at the side edge portion of the scintillator block can be further enhanced. For the reasons, in the radiation detector according to the present invention, it becomes possible to attain high resolution required for performing a DOI detection. By applying the radiation detector according to the present invention to a TOF-PET apparatus, it becomes possible to realize a TOF-PET apparatus capable of performing a DOI detection.

Further, in the aforementioned invention, it is preferable that the center portion have a shape having an area decreasing as it advances from a surface of the center portion coupled to the scintillator block toward a surface of the center portion coupled to the solid state light detector.

[Functions and Effects]

According to the present invention, the center portion has a shape having an area decreasing as it advances from the surface of the center portion coupled to the scintillator block toward the surface of the center portion coupled to the solid state light detector. For this reason, the area of the light receiving section detecting the scintillator light generated from the side edge portion of the scintillator block becomes wider. Therefore, the output of the electrical signal based on the scintillator light generated at the side edge portion of the scintillator block becomes much stronger.

Further, in the radiation detector according to the present invention, since the area of the light receiving section detecting the scintillator light becomes wider, it becomes possible to perform more complete gravity center calculation for the scintillator light incident to the light receiving section. Accordingly, the resolution of radiation image information based on the scintillator light at the side edge portion can be further enhanced.

Further, in the aforementioned invention, it is preferable that the center portion and the side peripheral portion be constituted by the same optical material and that the center portion, the reflector, and the side peripheral portions be bonded with each other by curing of the optical material.

[Functions and Effects]

According to the radiation detector of the aforementioned invention, the center portion and the side peripheral portions are constituted by the same optical material and that the center portion, the reflector, and the side peripheral portions are bonded with each other by curing of the optical material. That is, the light guide is easily integrally formed by curing of the optical material. For this reason, in the method for producing the light guide, it is not required to perform steps for fabricating the center portion, the reflector, and the side peripheral portions, and therefore the production step of the light guide can be simplified. Accordingly, the radiation detector according to the present invention can improve the production efficiency to thereby reduce the production cost.

Further, in the aforementioned invention, it is preferable that the optical material be any one of epoxy resin, silicon resin, and acrylic resin.

[Functions and Effects]

According to the radiation detector of the present invention, both of the center portion of the light guide and the side peripheral portions thereof are made of the same transparent resin. Therefore, attenuation of the scintillator light transmitted by the light guide can be controlled, which can prevent deterioration of the output of the radiation detector.

Further, in the aforementioned invention, it is preferable that the center portion and the side peripheral portions be constituted by different optical materials, the optical material constituting the center portion be higher in transparency than the optical material constituting the side peripheral portions, and the side peripheral portions and the reflector be bonded by curing of the optical material constituting the side peripheral portions.

[Functions and Effects]

According to the radiation detector of the present invention, the center portion and the side peripheral portions of the light guide partitioned by the reflector grating are made of different optical materials. That is, the center portion occupying a large area of the light guide is made of an optical material higher in transparency. Since the center portion is made of a material excellent in optical transparency, attenuation of the scintillator light incident to the light guide can be suppressed more appropriately. As a result, the output of the radiation detector is maintained in a high state, which makes it possible to obtain a radiation image high in resolution.

On the other hand, since the side peripheral portions and the reflector are bonded by curing of the optical material forming the side peripheral portions, even in cases where the side peripheral portion is partitioned into a number of blocks by the reflector, the side peripheral portions to which the reflector is bonded are integrally formed. For this reason, in the production step of the light guide, it is not required to perform a step for fabricating a number of blocks forming the side peripheral portion and the reflector. Further, since the center portion occupies a large part of the light guide, the surface of the optical material forming the center portion can be easily processed and polished. Therefore, a radiation detector can be produced easily at low cost.

Further, in the aforementioned invention, it is preferable that the optical material constituting the center portion be acrylic resin or silica glass.

[Functions and Effects]

According to the radiation detector of the present invention, the center portion of the light guide is constituted by acrylic resin or silica glass. Since both of acrylic resin and silica glass are optical materials extremely excellent in transparency, attenuation of the scintillator light incident to the light guide can be minimized. As a result, the output of the radiation detector is maintained in a higher state, which makes it possible to obtain a radiation image high in resolution.

Further, in the aforementioned invention, it is preferable that the optical material constituting the side peripheral portions be epoxy resin or silicon resin.

[Functions and Effects]

According to the radiation detector of the present invention, the side peripheral portion of the light guide is made of epoxy resin or silicon resin. Epoxy resin and silicon resin are both transparent thermosetting resin. Therefore, by burying the reflector in a liquid resin and then curing the resin by heating, side peripheral portions to which the reflector is bonded can be easily formed. Therefore, a radiation detector can be produced easily at lower cost.

Further, in the aforementioned invention, it is preferable that a light receiving element constituting the solid state light detector be a SiPM element or an APD element.

[Functions and Effects]

According to the radiation detector of the present invention, as the light receiving element, a SiPM element or an APD element is used. These elements are less affected by a magnetic field generated from a magnetic resonance tomographic apparatus (MR apparatus). For this reason, the radiation detector according to the present invention can be applied to a positron-emission tomography-magnetic resonance imaging complex apparatus (PET-MR). That is, a radiation image high in resolution can be obtained, which enables to provide a PET-MR including a radiation detector low in production cost.

To attain the aforementioned objects, the present invention may have the following configuration.

That is, the method for producing a radiation detector according to the present invention includes: a grating formation step in which a reflector grating is formed by combing light reflective members; a grating fit-in step in which after the grating formation step, the reflector grating is fit in a mounting tub provided in a molding frame; a pouring step in which after the grating fit-in step, curing resin is poured in the mounting tub so that the reflector grating is buried in the curing resin; a resin curing step in which after the pouring step, a light guide in which the reflector grating is sealed is produced by curing the curing resin; and a bonding step in which after the resin curing step, the produced light guide is optically coupled to each of a scintillator block and a solid state light detector, wherein in the bonding step, the scintillator block and the light guide are coupled such that surfaces of side peripheral portions of the light guide face surfaces of scintillator crystals positioned at a side edge portion of the scintillator block among scintillator crystals constituting the scintillator block.

[Functions and Effects]

According to the method for producing the radiation detector of the present invention, in the bonding step, the scintillator block and the light guide are optically coupled so that surfaces of the scintillator crystals positioned at side edge portions of the scintillator block among the scintillator crystals constituting the scintillator block and surfaces of the side peripheral portions constituting the light guide face each other. Thus, the scintillator light generated at the side edge portion of the scintillator block can be more assuredly incident to the side peripheral portion of the light guide. Accordingly, the resolution of the radiation image based on the scintillator light generated at the side edge portion of the scintillator block can be further enhanced. By applying the radiation detector according to the invention to a TOF-PET apparatus, it becomes possible to realize a TOF-PET apparatus capable of performing a DOI detection.

Further, the curing resin is poured into the mounting tub in the pouring step, so that the reflector grating is buried in the curing resin. Thus, a light guide in which the reflector grating is sealed in the resin curing step is produced. That is, the center portion and the side peripheral portions forming the light guide are formed by the same curing resin. Then, the center portion, the reflector, and the side peripheral portions forming the light guide are bonded by curing of the optical material. That is, the light guide is easily integrally formed by curing of the optical material. For this reason, in the method for producing the light guide, it is not required to perform steps for fabricating the center portion, the reflector, and the side peripheral portions, and therefore the production step of the light guide can be simplified. Accordingly, the radiation detector according to the present invention can improve the production efficiency to thereby reduce the production cost.

Further, in the aforementioned invention, it is preferable that in the grating fit-in step, the light reflective members constituting the reflector grating be fit in in a state in which each light reflective member is inclined inwardly toward a bottom surface of the mounting tub so that a lower side position of each light reflective member is positioned at a center side of the grating than an upper side position of each light reflective member.

[Functions and Effects]

According to the method for producing a radiation detector of the present invention, in the grating fit-in step, the light reflective members constituting the reflector grating are fit in in a state in which each light reflective member is inclined inwardly toward a bottom surface of the mounting tub so that a lower side position of each light reflective member is positioned at a center side of the grating than an upper side position of each light reflective member. That is, in the radiation detector to be produced, the light guide is constituted such that the buried reflector is inclined inwardly as it advances from the surface of the light guide coupled to the scintillator block toward the surface of the light guide coupled to the solid state light detector. For this reason, the area of the light receiving section detecting the scintillator light generated from the side edge portion of the scintillator block becomes wider. Therefore, the output of the electrical signal based on the scintillator light generated at the side edge portion of the scintillator block becomes stronger.

Further, since the area of the light receiving section detecting the scintillator light becomes larger, it becomes possible to perform more complete gravity center calculation for the scintillator light incident to the light receiving section. Accordingly, the resolution of radiation image information based on the scintillator light at the side edge portion can be further enhanced.

Further, in the aforementioned invention, it is preferable that the curing resin be any one of epoxy resin, silicon resin, and acrylic resin.

[Functions and Effects]

According to the method for producing a radiation detector of the present invention, both of the center portion and the side peripheral portions of the light guide are made of the same transparent curing resin. Therefore, attenuation of the scintillator light transmitted by the light guide can be suppressed, which can prevent deterioration of the output of the radiation detector.

To attain the aforementioned objects, the present invention may have the following configuration.

That is, a method for producing a radiation detector, includes: a grating formation step in which a reflector grating is formed by combining light reflective members; a grating fit-in step in which after the grating formation step, the reflector grating is fit in a mounting tub provided in a molding frame; a center portion fit-in step in which after the grating fit-in step, an optical material is fitted inside the reflector grating; a pouring step in which after the center portion fit-in step, curing resin is poured in the mounting tub so that the reflector grating and the optical material are buried in the curing resin; a resin curing step in which after the pouring step, the curing resin is cured to form a light guide in which a center portion, the reflector grating, and side peripheral portions are bonded; and a bonding step in which after the resin curing step, the formed light guide is optically coupled to each of a scintillator block and a solid state light detector, wherein the optical material is higher in transparency than the curing resin, and wherein in the bonding step, the scintillator block and the light guide are optically coupled so that surfaces of the scintillator crystals positioned at a side edge portion of the scintillator block among the scintillator crystals constituting the scintillator block and surfaces of the side peripheral portions constituting the light guide face each other.

[Functions and Effects]

According to the method for producing a radiation detector according to the present invention, the center portion of the light guide is fitted inside the reflector grating in the fit-in step. The side peripheral portions of the light guide are formed in the resin curing step by curing of the curing resin poured in the mounting tub in the pouring step. That is, the center portion and the side peripheral portions are formed by the different materials. The center portion of the light guide is formed by an optical material higher in transparency. Since the center portion is made of a material excellent in optical transparency, attenuation of the scintillator light incident to the light guide can be suppressed more appropriately. As a result, the output of the radiation detector is maintained in a higher state, which makes it possible to obtain a radiation image higher in resolution.

On the other hand, since the side peripheral portions and the reflector are bonded by curing of the optical material forming the side peripheral portions, even in cases where the side peripheral portion is partitioned into a number of blocks by the reflector, the side peripheral portions to which the reflector is bonded are integrally formed. For this reason, in the production step of the light guide, it is not required to perform a step for fabricating a number of blocks forming the side peripheral portions and the reflector. Further, since the center portion occupies a great part of the light guide, the surface of the optical material forming the center portion can be easily processed and polished. Therefore, a radiation detector can be produced by simple steps at low cost.

To attain the aforementioned objects, the present invention may have the following configuration.

That is, a method for producing a radiation detector according to the present invention: a grating formation step in which a reflector grating is formed by combining light reflective members; a grating fit-in step in which after the grating formation step, the reflector grating is fit in a mounting tub provided in a molding frame; a pouring step in which after the grating fit-in step, curing resin is poured in the mounting tub so that the reflector grating is buried in the curing resin; a resin curing step in which after the pouring step, the curing resin is cured to form a temporary assembly in which the reflector grating and side peripheral portions are bonded; a center portion fit-in step in which after the resin curing step, an optical material higher in transparency than the curing resin is fitted in and adhered to the concave portion formed in a center of the temporary assembly to form a light guide; and a bonding step in which after the center portion fit-in step, the formed light guide is optically coupled to each of the formed scintillator block and a solid state light detector, wherein in the grating fit-in step, the reflector grating is fitted so as to cover a side wall of a convex portion provided at a mounting tub, and wherein in the bonding step, the scintillator block and the light guide are optically coupled so that surfaces of the scintillator crystals positioned at side edge portions of the scintillator block among the scintillator crystals constituting the scintillator block and surfaces of the side peripheral portions constituting the light guide face each other.

[Functions and Effects]

According to the method for producing a radiation detector according to the present invention, the center portion fit-in step is performed after the resin curing step. That is, through a series of production steps, the incident surface of the center portion and the thermosetting resin are not brought into contact with each other. Accordingly, the incident surface of the center portion is kept in an optically polished state, and therefore the radiation detector capable of demonstrating more preferable optical performance can be produced. Further, the center portion occupying a great part of the light guide is made of an optical material more excellent in transparency, and the side peripheral portions are made of curing resin. For this reason, the radiation detector produced by the production method according to the present invention can realize a high resolution also at the side edge portions of the scintillator block and reduce the production cost.

Further, in the aforementioned invention, in the grating fit-in step, it is preferable that the convex portion provided in the mounting tub has a tapered shape.

[Functions and Effects]

According to the method for producing a radiation detector of the present invention, the convex portion provided in the mounting tub is a tapered shape. For this reason, in the light guide to be formed, the center portion has a shape having an area decreasing as it advances from the surface of the center portion coupled to the scintillator block toward the surface of the center portion coupled to the solid state light detector. For this reason, the area of the light receiving section detecting the scintillator light generated from the side edge portion of the scintillator block becomes larger. Therefore, the output of the electrical signals based on the scintillator light generated at the side edge portion of the scintillator block becomes stronger.

Further, in the radiation detector according to the present invention, since the area of the light receiving section detecting the scintillator light becomes larger, it becomes possible to perform more complete gravity center calculation for the scintillator light incident to the light receiving section. Accordingly, the resolution of radiation image information based on the scintillator light at the side edge portion can be further enhanced.

Further, in the aforementioned invention, it is preferable that the optical material constituting the center portion be acrylic resin or silica glass.

[Functions and Effects]

According to the method for producing a radiation detector according to the present invention, the center portion occupying the large part of the light guide is made of acrylic resin or silica glass. Since both of acrylic resin and silica glass are optical materials extremely excellent in transparency, attenuation of the scintillator light incident to the light guide can be minimized. As a result, the output of the radiation detector is maintained in a higher state, which makes it possible to obtain a radiation image higher in resolution.

Further, in the aforementioned invention, it is preferable that the optical material constituting the side peripheral portion be epoxy resin or silicon resin.

[Functions and Effects]

According to the method for producing the radiation detector according to the present invention, the side peripheral portions of the light guide are made of epoxy resin or silicon resin. Since both of epoxy resin and silicon resin are thermosetting resin, by burying the reflector in liquid resin and then curing the resin by heating, side peripheral portions to which the reflector is bonded can be easily formed. Therefore, a radiation detector can be produced by simpler steps at lower cost.

Further, in the aforementioned invention, it is preferable that the light receiving element constituting the solid state light detector is a SiPM element or an APD element.

[Functions and Effects]

According to the method for producing a radiation detector according to the present invention, as the light receiving element, a SiPM element or an APD element is used. Since these elements are less affected by the magnetic field generated by an MR apparatus, the radiation detector according to the present invention can be applied to a PET-MR. That is, a radiation image high in resolution can be obtained, which enables to provide a PET-MR including a radiation detector low in production cost.

Effects of the Invention

According to the radiation detector and the method for producing the radiation detector according to the present invention, the scintillator block and the light guide are optically coupled so that surfaces of the scintillator crystals positioned at side edge portions of the scintillator block among the scintillator crystals constituting the scintillator block and surfaces of the side peripheral portions constituting the light guide face each other. Thus, the scintillator light generated at the side edge portion of the scintillator block can be more assuredly incident to the side peripheral portion of the light guide. Accordingly, the resolution of the radiation image based on the scintillator light generated at the side edge portion of the scintillator block can be further enhanced. As a result, according to the radiation detector of the present invention, it becomes possible to attain high resolution required for preforming a DOI detection.

Further, in producing the light guide, it is not required to perform steps for fabricating the center portion, the reflector, and therefore the side peripheral portions, the production of the light guide can be simplified. This improves the production efficiency of the radiation detector according to the present invention and reduces the production cost. Therefore, by applying the radiation detector according to the invention to a TOF-PET apparatus, it becomes possible to realize a TOF-PET apparatus capable of performing a DOI detection.

BRIEF DESCRIPTION OF THE DRAWINGS

FIG. 1 is a schematic view showing a structure of a radiation detector according to Embodiment 1, wherein

FIG. 5 is a schematic view illustrating a grating formation step according to Embodiment 1, wherein

FIG. 6 is a vertical cross-sectional view illustrating a method for producing the radiation detector according to Embodiment 1, wherein

FIG. 7 is a vertical cross-sectional view illustrating a method for producing the radiation detector according to Embodiment 1, wherein

FIG. 8 is an explanatory view of a bonding step according to Embodiment 1, wherein

FIG. 9 is a vertical cross-sectional view comparing a radiation detector according to Embodiment 1 and a conventional radiation detector, wherein

FIG. 11 is a vertical cross-sectional view illustrating a method for producing a radiation detector according to Embodiment 2, wherein

FIG. 13 is a vertical cross-sectional view illustrating a method for producing a radiation detector according to Embodiment 3, wherein

FIG. 14 is a vertical cross-sectional view illustrating a method for producing a radiation detector according to Embodiment 3, wherein

EMBODIMENTS FOR CARRYING OUT THE INVENTION

Embodiment 1

Hereinafter, Embodiment 1 according to the present invention will be described with reference to the attached drawings.

<Description of General Structure>

Figure 1A:
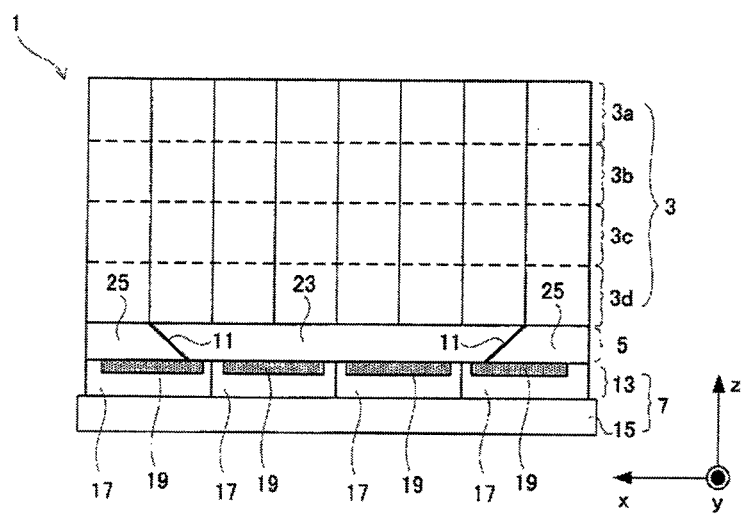
FIG. 1A is a vertical cross-sectional view showing an entire structure of the radiation detector.

As shown in FIG. 1A, a radiation detector 1 according to Embodiment 1 has a structure in which a scintillator block 3, a light guide 5, and a solid state light detector 7 are laminated from above in this order and optically coupled with each other. FIG. 1A is a cross-sectional view taken along the x-z plane, but the cross-sectional view taken along the y-z plane is the same as the cross-sectional view taken along the x-z plane.

The scintillator block 3 is structured such that scintillator crystals which emit scintillator light by absorbing a γ-ray (gamma ray) emitted from a subject are three-dimensionally arranged. In detail, scintillator crystal layers $3a$, $3b$, $3c$ and $3d$ each including two-dimensionally arranged scintillator crystals are laminated in a z-direction, forming a scintillator block 3. The z-direction denotes a depth direction of the scintillator block 3. The scintillator crystal layer $3a$ forms an incident surface of the scintillator block 3 for a γ-ray (gamma ray). The scintillator crystal layers $3a$, $3b$, $3c$, and $3d$ are optically coupled. As such scintillator crystal, an inorganic crystal, such as, e.g., LYSO, LSO, and NaI, can be used.

Figure 1B:
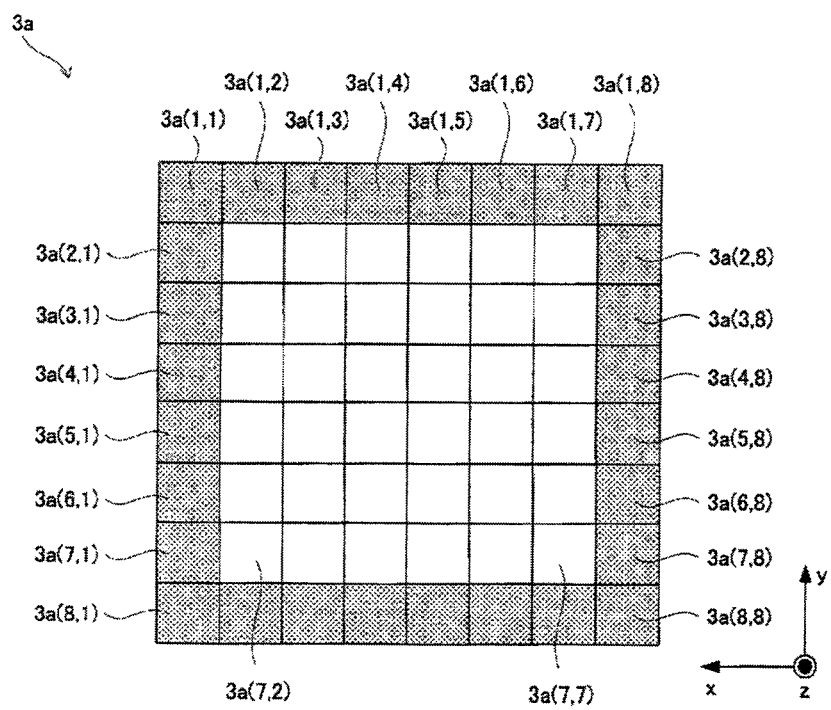
FIG. 1B is a plan view showing a structure of a scintillator crystal layer.

Each structure of the scintillator crystal layers $3a$, $3b$, $3c$, and $3d$ will be described. The scintillator crystal layer $3a$ is, as shown in FIG. 1B showing a planner view thereof, structured such that block-shaped scintillator crystals are arranged in an 8 (eight)×8 eight) matrix in the x-y direction with respect to the scintillator crystal $3a$ (1, 1). That is, the scintillator crystal $3a$ (1, 1) to the scintillator crystal $3a$ (1, 8) are arranged in the x-direction to form a scintillator crystal array. The eight scintillator crystal arrays are arranged in the y-direction to form the scintillator crystal layer $3a$. In the same manner, each of the scintillator crystal layers $3b$, $3c$, and $3d$ is structured such that scintillator crystals are arranged in an eight (8)×eight (8) matrix in the x-y direction with respect to the respective scintillator crystal $3b$ (1, 1), the scintillator crystal $3c$ (1, 1), and the scintillator crystal $3d$ (1, 1).

The light guide 5 includes a reflector grating 11 sealed therein, and transmits the scintillator light emitted from the scintillator block 3 to the solid state light detector 7. The light guide 5 is made of an optical material high in transparency. As examples of the optical material forming the light guide 5, epoxy resin, silicon resin, and acrylic resin are exemplified. In Embodiment 1, epoxy resin is used. Hereinafter, the surface of the light guide 5 which is in contact with the scintillator block 3 will be referred to as an "incident surface," and the surface of the light guide 5 which is in contact with the solid state light detector 7 will be referred to as a "transmission surface".

Figure 2:
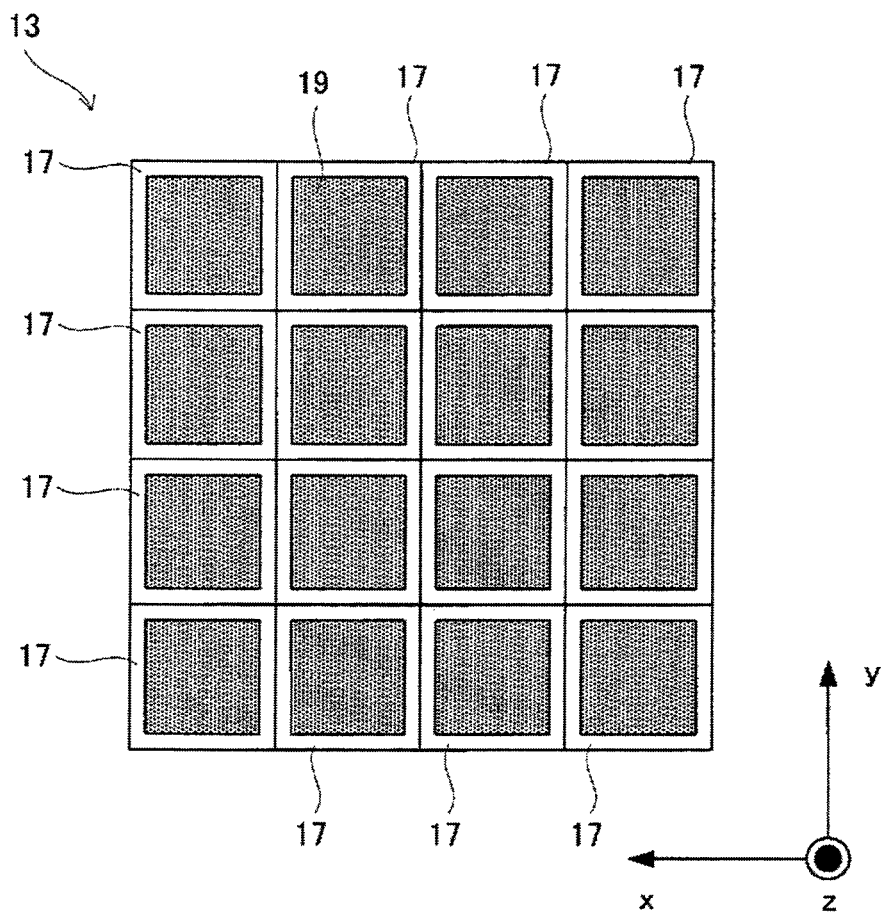
FIG. 2 is a plan view showing a schematic structure of a light receiving element array according to Embodiment 1.

The solid state light detector 7 is provided with a light receiving element array 13 and a substrate portion 15. The light receiving element array 13 is structured, as shown in FIG. 2, such that light receiving elements 17 are arranged in a 4×4 matrix in the x-y direction. The substrate portion 15 is provided under the light receiving element array 13 to perform processing of electrical signals converted by a light receiving section 19.

On the surface of the light receiving element 17 on the light guide 5 side, the light receiving sections 19 are provided. In the light receiving section 19, the scintillator light transmitted by the light guide 5 is detected and converted into electrical signals. As the light receiving element 17, a SiPM (Silicon Photo Multiplier) element is used.

Figure 3A:
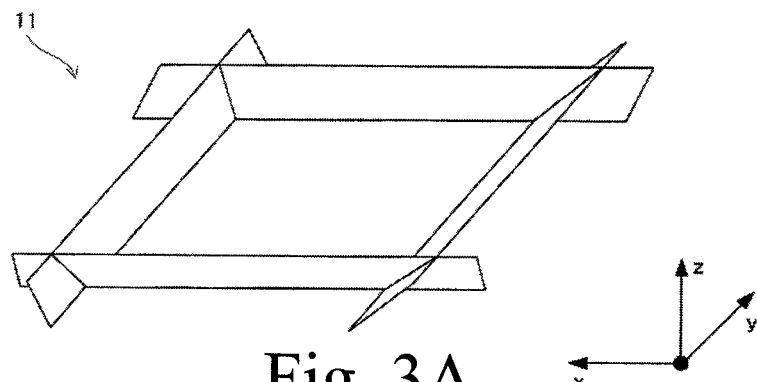
FIG. 3A is a perspective view showing a structure of a reflector grating according to Embodiment 1.
Figure 3B:
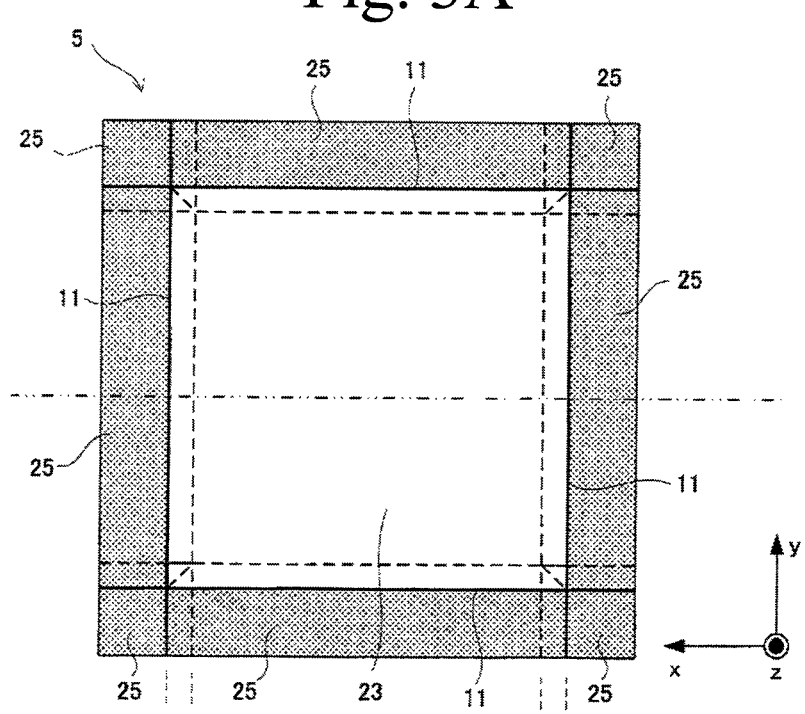
FIG. 3B is a plan view showing a schematic structure of a light guide according to Embodiment 1.
Figure 3C:
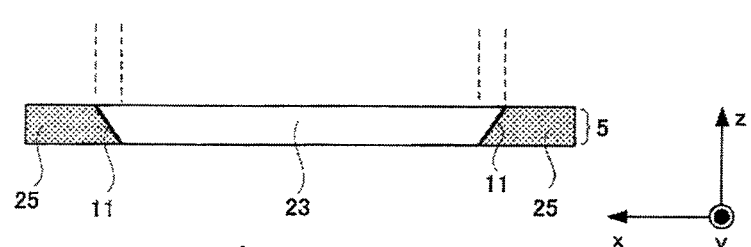
FIG. 3C is a vertical cross-sectional view showing a schematic structure of the light guide according to Embodiment 1.

Next, the structure of the light guide 5 and that of the reflector grating 11 will be described in detail. As shown in FIG. 3A, the reflector grating 11 has a structure in which rectangular light reflective members are combined in a lattice shape. As the light reflective member, an ESR film (Enhanced Specular Reflective Film) made by 3M (trademark) and a white plastic can be exemplified. The height of the reflector grating 11 in the z-direction is adjusted to be the same height of the light guide 5 in the z-direction. The light guide 5 is partitioned, as shown in FIG. 3B and FIG. 3C, by the reflector grating 11 into a center portion 23 and side peripheral portions 25 shown with dots. The reflector grating 11 corresponds to a reflector according to the present invention.

Each light reflective member constituting the reflector grating is arranged, as shown in FIG. 3C, so as to incline inwardly so that the transmission surface side (lower side) of the light reflective member is positioned at the center side of the reflector grating than the incident surface side (upper side). That is, the center portion 23 is formed to have a tapered structure in which the transverse section decreases from the incident surface of the light guide 5 toward the transmission surface thereof. The side peripheral portion 25 is formed to have a tapered structure in which the width increases from the incident surface of the light guide 5 toward the transmission surface thereof.

The positional relationship between the scintillator block 3 and the light guide 5 will be further described. As shown in FIG. 1A, at the incident surface of the light guide 5, the side peripheral portions 25 arranged in a square shape in a planner view are optically coupled to the scintillator crystals positioned at the side edge portion. Specifically describing it with reference to FIG. 1B, the side peripheral portions 25 are optically coupled to each of the scintillator crystals $3d$ (1, 1) to $3d$ (1, 8), $3d$ (2, 1), $3d$ (2, 8), . . . $3d$ (8, 1) to $3d$ (8, 8) shown with dots on the incident surface. On the other hand, the center portion 23 is optically coupled to each of the scintillator crystals $3d$ (2, 2) to $3d$ (2, 7), $3d$ (3, 2) to $3d$ (3, 7), . . . $3d$ (7, 2) to $3d$ (7, 7) positioned in the inner side region of the scintillator crystals arranged on the side edge portions on the incident surface.

Figure 4:
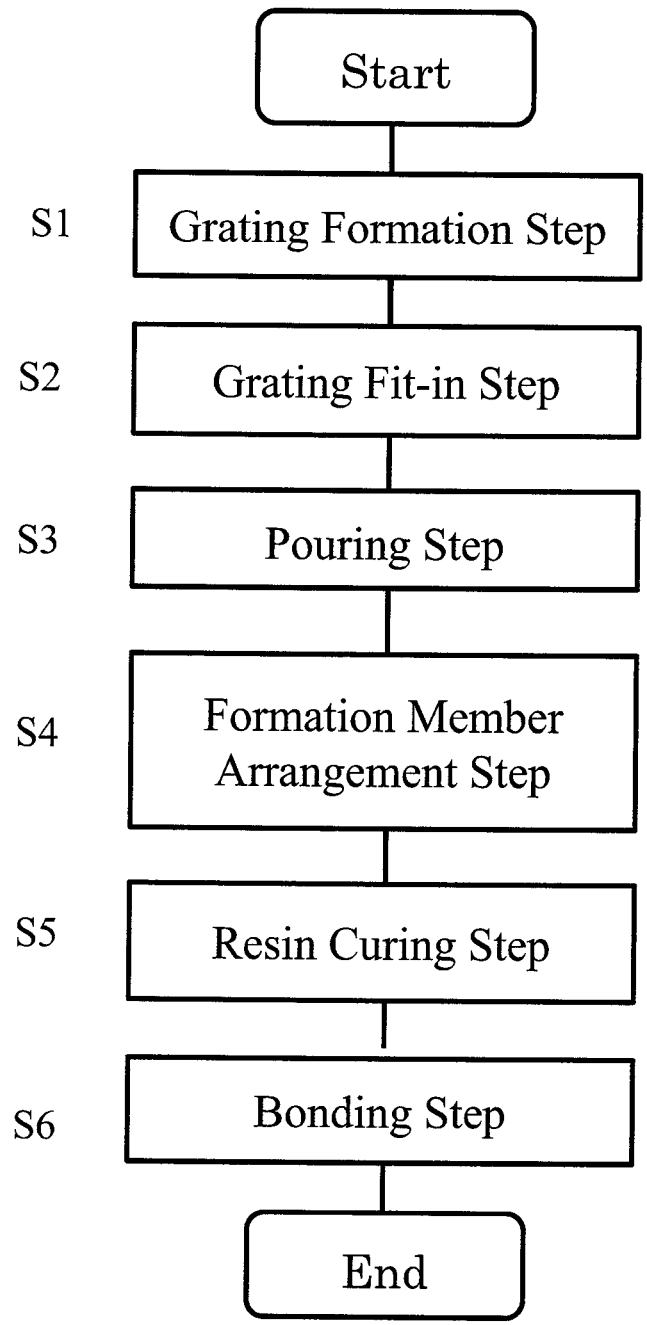
FIG. 4 is a flowchart describing a method for producing the radiation detector according to Embodiment 1.

A method for producing the radiation detector according to Embodiment 1 having the aforementioned structure will be described below. FIG. 4 is a flowchart describing the method for producing the radiation detector according to Embodiment 1.

Step S1 (Grading Formation Step)

Figure 5A:
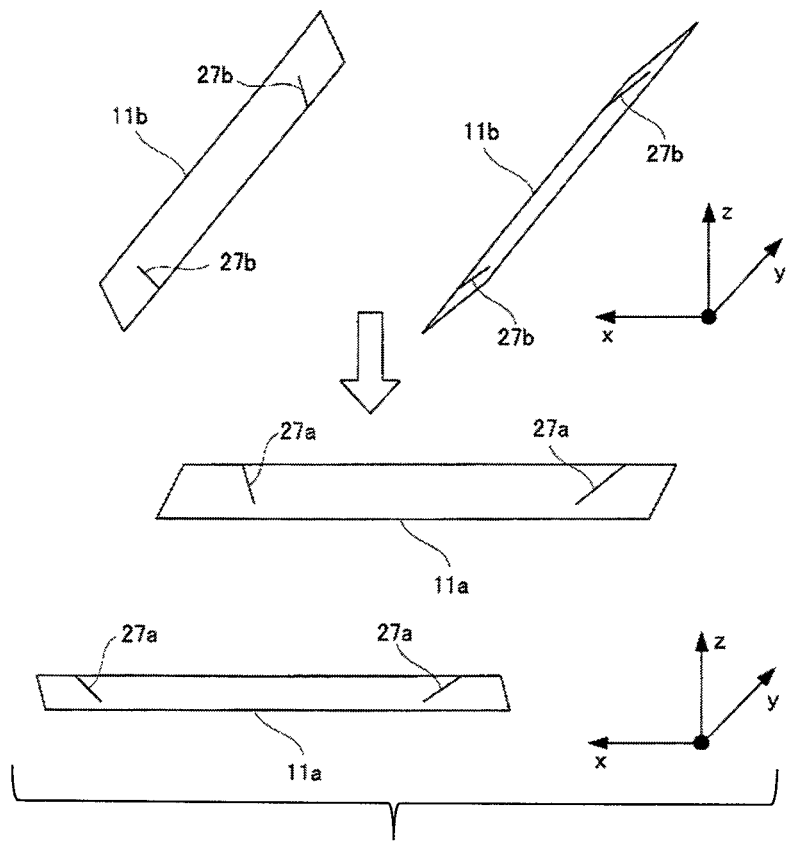
FIG. 5A is a perspective view showing reflection members before assembling the reflector grating.

Initially, as shown in FIG. 5A, in order to form the reflector grating 11, two pieces of first reflection members 11a are arranged in the y-direction, and two pieces of second reflection members 11b are arranged in the x-direction. The first reflection member 11a is a rectangular member made of a light reflective member and the longitudinal direction extends in the x-direction. The first reflection member 11a is arranged so as to incline inwardly so that the lower side of the first reflection member is positioned at the central side of the grating than the upper side of the first reflection member. Each of the first reflection members 11a is provided with slits 27a to combine the second reflection member 11b.

Figure 5B:
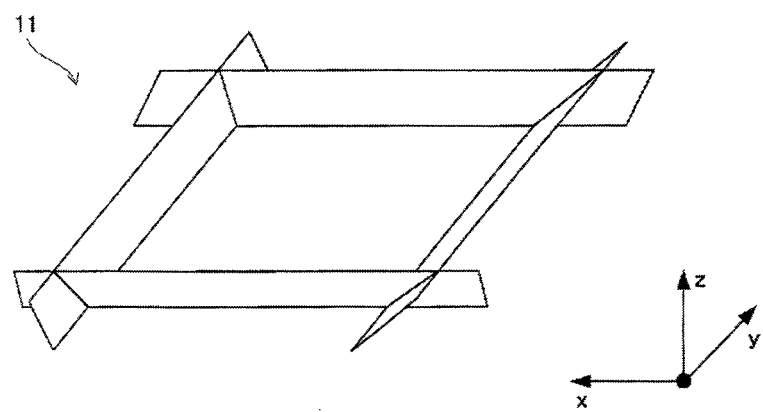
FIG. 5B is a perspective view showing the reflector grating after the assembly.

The second reflection member 11b is also a rectangular member made of a light reflective member like the first reflection member 11a. The longitudinal direction of the second reflection member 11b extends in the y-direction. The second reflection member 11b is arranged so as to incline inwardly. Further, each of the second reflection members 11b is provided with slits 27b. By fitting the slit 27a and the slit 27b with each other, the first reflection members 11a and the second reflection members 11b are integrally combined. Thus, as shown in FIG. 5B, a reflector grating 11 in which the reflecting members are combined in a lattice shape is formed.

Step 2 (Grating Fit-in Step)

Figure 6A:
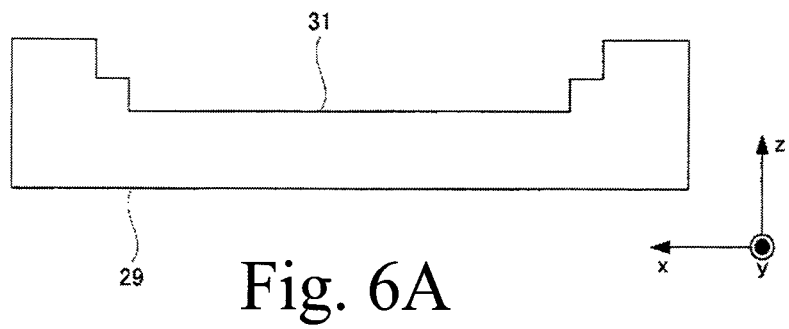
FIG. 6A is a vertical cross-sectional view illustrating a structure of a molding frame according to Embodiment 1.

After the formation of the reflector grating 11, a grating fit-in step is initiated. The molding frame 29 is, as shown in FIG. 6A, provided with a mounting tub 31 opening upward in the z-direction and having a rectangular shape in a planner view. Dimensions of the mounting tub 31 in the x-direction, y-direction, and z-direction are set to be approximately the same as dimensions of the light guide 5 in the x-direction, y-direction, and z-direction, respectively.

Figure 6B:
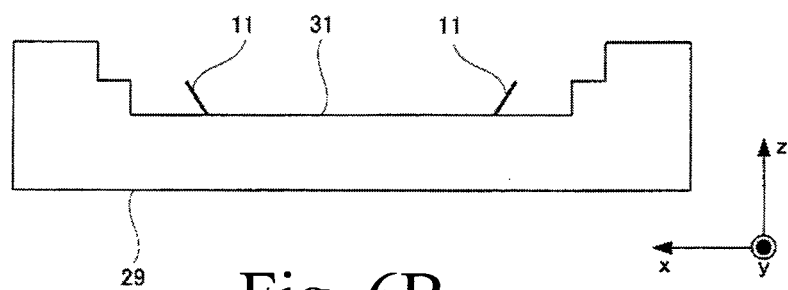
FIG. 6B is a vertical cross-sectional view illustrating a grating fit-in step according to Embodiment 1.

In the grating fit-in step, as shown in FIG. 6B, the reflector grating 11 is fitted in the mounting tub 31 in the z-direction. At this time, the length of the mounting tub 31 in the x-direction is approximately the same as the length of the first refection member 11a in the longitudinal direction, and the length of the mounting tub 31 in the y-direction is approximately the same as the length of the second reflection member 11b in the longitudinal direction. Therefore, when the reflector grating 11 is fitted in the mounting tub 31, the side edge portions of the reflector grating 11 are in a contact with the respective side end faces of the mounting tub 31. To facilitate releasing of the cured thermosetting resin, a mold releasing agent may be applied to the mounting tub 31 in advance.

Step 3 (Pouring Step)

Figure 6C:
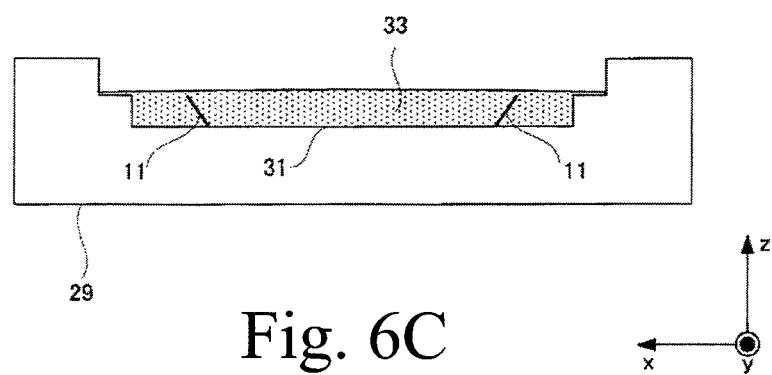
FIG. 6C is a vertical cross-sectional view illustrating a pouring step according to Embodiment 1.

After fitting the reflector grating 11 in the mounting tub 31, a pouring step is initiated. That is, as shown in FIG. 6C, thermosetting resin 33 is poured onto the entire surface of the mounting tub 31. In the pouring step, as the thermosetting resin 33, a liquid resin before curing is used. Therefore, the liquid thermosetting resin 33 readily fills the mounting tub 31 and infiltrates both surfaces of the reflector grating 11. Thus, the reflector grating 11 fitted in the mounting tub 31 is buried in the thermosetting resin 33 in the pouring step. After burying the reflector grating 11 in the thermosetting resin 33, sufficient vacuum degassing is performed against the thermosetting resin 33. As the thermosetting resin 33, a material high in transparency is used. In Embodiment 1, as the thermosetting resin 33, epoxy resin is used.

Step 4 (Shaping Member Arrangement Step)

Figure 7A:
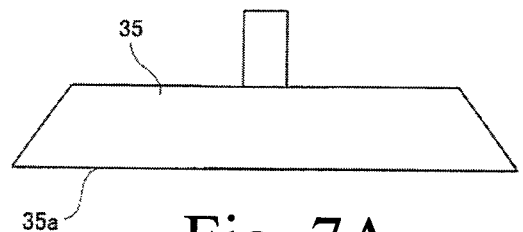
FIG. 7A is a vertical cross-sectional view illustrating a structure of a shaping member according to Embodiment 1.

After pouring the thermosetting resin 33 into the mounting tub 31, initially, a shaping member 35 is arranged so as to cover the mounting tub 31 of the molding frame 29. The shaping member is provided with a planar shaped bottom surface 35a as shown in FIG. 7A. The x-directional length of the bottom surface 35a is set to be longer than the longitudinal direction length of the first reflection member 11a. In the same manner, the y-directional length of the bottom surface 35a is set to be longer than the longitudinal direction length of the second reflection member 11b. In other words, the bottom surface 35a is configured to be larger than the mounting tub 31. The shaping member 35 has a tapered structure tapering from the bottom surface 35a in the z-direction.

Figure 7B:
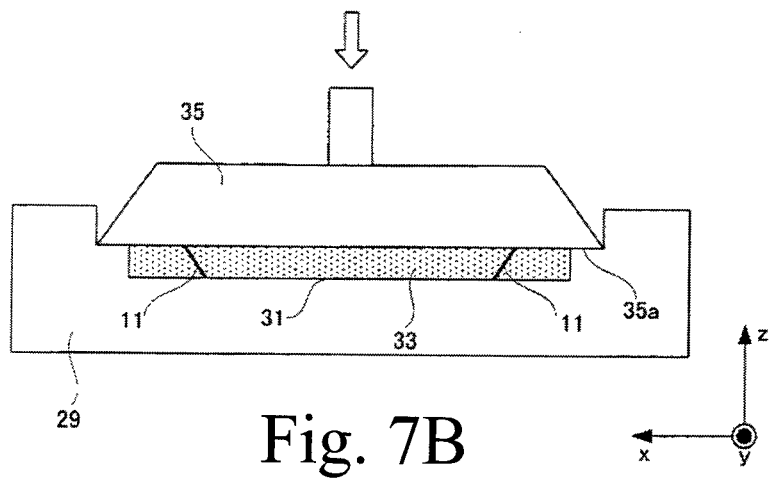
FIG. 7B is a vertical cross-sectional view illustrating a shaping member arrangement step according to Embodiment 1.

As described above, the bottom surface 35a is configured to be larger than the mounting tub 31. For this reason, in the shaping member arrangement step, when the shaping member 35 is arranged, as shown in FIG. 7B, the liquid surface of the thermosetting resin 33 filled in the mounting tub 31 is covered by the bottom surface 35a over the entire surface. In this covering step, it is preferable to arrange the shaping member 35 while taking a sufficient time to prevent invasion of bubbles in between the liquid surface of the thermosetting resin 33 and the bottom surface 35a. The bottom surface 35a is formed into a planner shape, and therefore the liquid surface of the thermosetting resin 33 becomes flat. To facilitate detachment of the cured thermosetting resin 33, a mold releasing agent may be applied to the bottom surface 35a of the shaping member 35 in advance.

Step 5 (Resin Curing Step)

After arranging the shaping member 35 on the mounting tub, a resin curing step is initiated. That is, in a state in which the shaping member 35 is arranged, the molding frame 29 is put in an oven kept at a predetermined temperature to cure the thermosetting resin 33. When the thermosetting resin 33 is cured, the resin becomes solid resin high in transparency. As described above, in the pouring step Step S3, the thermosetting resin 33 is poured into the entire surface of the mounting tub 31, so that the reflector grating 11 is buried in the thermosetting resin 33. For this reason, when the thermosetting resin 33 is cured, a light guide 5 in which the reflector grating 11 is buried in the cured thermosetting resin 33 is formed. That is, in the light guide 5 formed in Embodiment 1, the center portion 23 and the side peripheral portions 25 are integrally formed, and each of the center portion 23 and the side peripheral portions 25 is made of thermosetting resin 33.

Figure 7C:
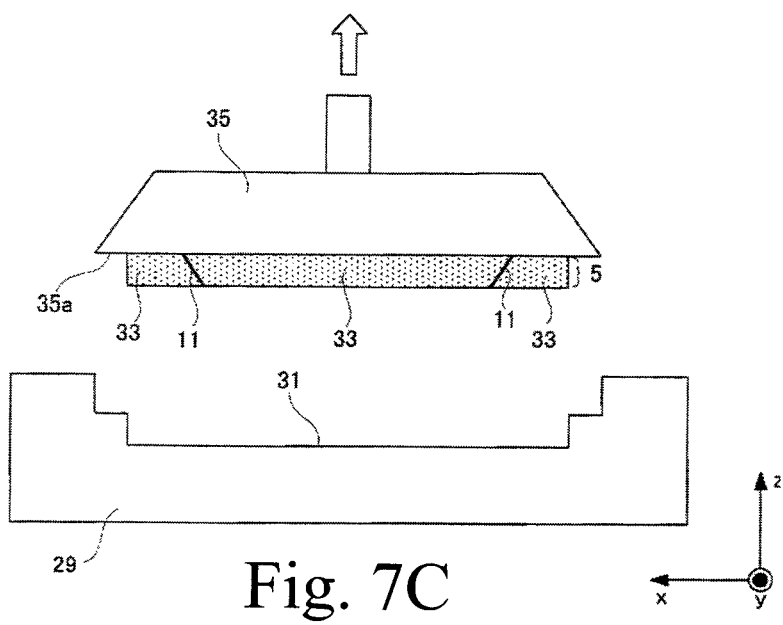
FIG. 7C is a vertical cross-sectional view illustrating a resin curing step according to Embodiment 1.

After forming the light guide 5, as shown in FIG. 7C, the shaping member 35 is lifted up in the z-direction or in a direction departing from the molding frame 29. The formed light guide 5 is pulled out from the mounting tub 31 together with the shaping member 35 to be detached from the molding frame 29. After the detachment, both of the surface of the light guide 5 which was in contact with the shaping member and the surface of the light guide 5 which was in contact with the mounting tub 31 may be polished as needed. By detaching and polishing the light guide 5, the resin curing step is terminated, and a series of steps for producing the light guide 5 is completed. Each of FIGS. 5 to 7 is a cross-sectional view taken along the x-z plane, and the cross-sectional view taken along the y-z plane has also the same cross-sectional view.

Step 6 (Bonding Step)

Figure 8A:
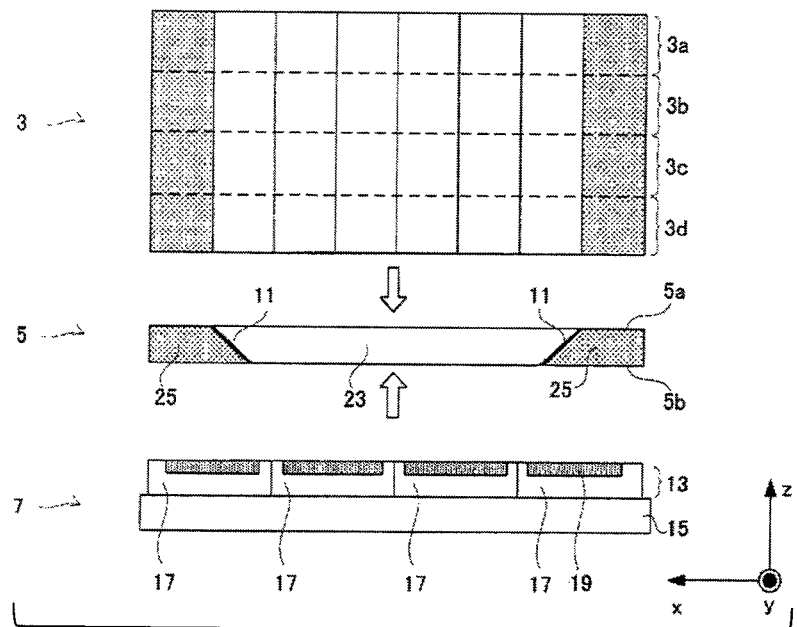
FIG. 8A is a vertical cross-sectional view illustrating a relationship of joining positions of the scintillator block, the light guide, and the solid state light detector.

After completion of the resin curing step, a bonding step is initiated. That is, as shown in FIG. 8A, the scintillator block 3 and the solid state light detector 7 are optically coupled to the produced light guide 5. At this time, as for the upper and lower surfaces of the light guide 5, one of the upper and lower surfaces which is wider in the center portion 23 will be referred to as an incident surface 5a, and the other of the upper and lower surfaces which is narrower in the center portion 23 will be referred to as a transmission surface 5b. The incident surface 5a of the light guide 5 and the scintillator crystal layer 3d constituting the scintillator block 3 are brought into optical coupling via optical adhesive. The transmission surface 5b of the light guide 5 and the solid state light detector 7 are also brought into optical coupling via optical adhesive.

Figure 8B:
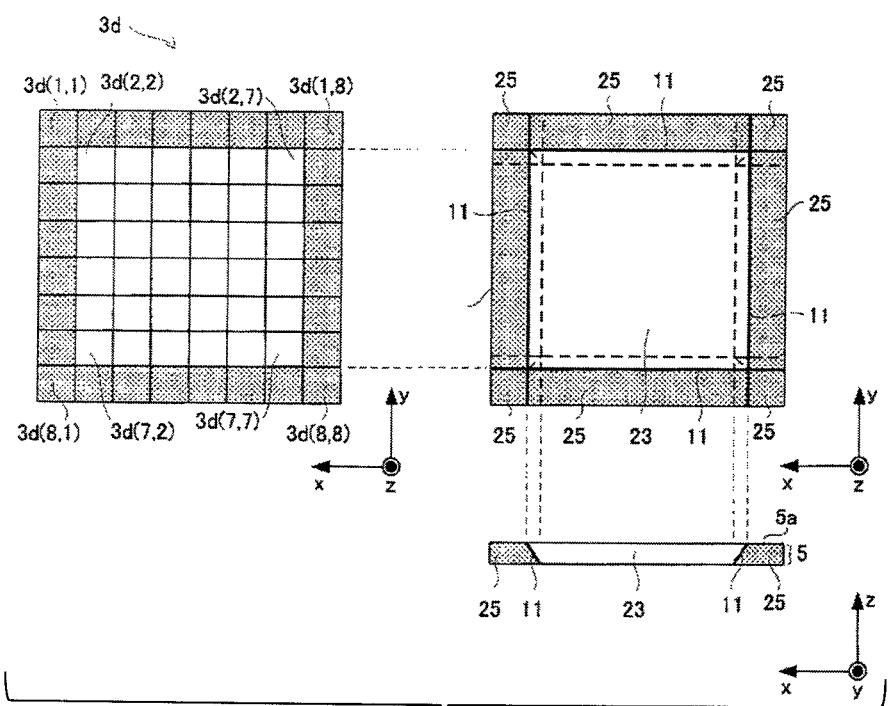
FIG. 8B is a plan view illustrating a relationship of joining positions of the scintillator and the light guide. The view shown on the left side of FIG. 8B is a plan view of the scintillator crystal layer and the view shown on the right side of FIG. 8B is a plan view of the light guide.

In coupling the incident surface 5a and the scintillator crystal layer 3d, the scintillator crystals positioned at the side edge portions of the scintillator crystal layer 3d and the side peripheral portions 25 of the light guide 5 are brought into optical coupling. In detail, the scintillator crystals 3d (1, 1) to 3d (1, 8), 3d (2, 1), 3d (2, 8), . . . 3d (8, 1) to 3d (8, 8) shown with dots on the left side of FIG. 8B are brought into optical coupling to the incident surfaces 5a of the side peripheral portions 25 shown with dots on the right side of FIG. 8A. The side peripheral portions 25 are partitioned by the reflector grating 11. On the other hand, the scintillator crystals 3d (2, 2) to 3d (2, 7), 3d (3, 2) to 3d (3, 7), . . . , 3d (7, 2) to 3d (7, 7) positioned in the inner side region of the scintillator crystals of the side edge portions and the incident surface 5a of the center portion 23 are brought into optical coupling. When optically coupling the light guide 5, the scintillator block 3 and the solid state light detector 7, the entire steps according to Embodiment 1 are completed. Thus, the radiation detector 1 is obtained.

<Effects by Structure of Embodiment 1>

As described above, according to the method for producing the radiation detector of Embodiment 1, it becomes possible to produce a radiation detector which has attained high resolution also at the side edge portions of the scintillator block. Hereinafter, effects by the structure of Embodiment 1 will be described with reference to FIG. 9.

Figure 9A:
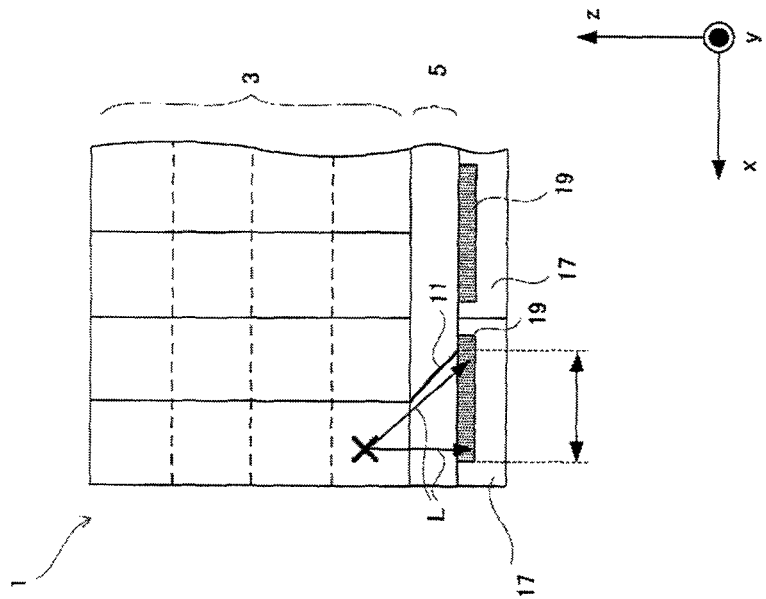
FIG. 9A illustrates a conventional radiation detector and FIG. 9B illustrates a radiation detector according to Embodiment 1.
Figure 18A:
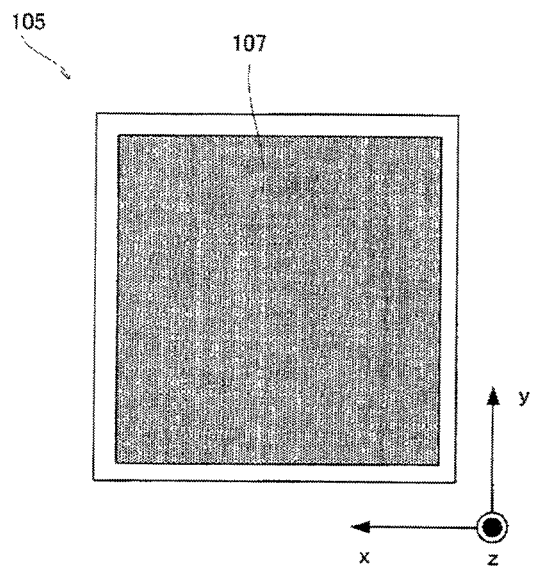
FIG. 18A is a plan view showing a structure of a solid state light detector according to a conventional example.
Figure 18B:
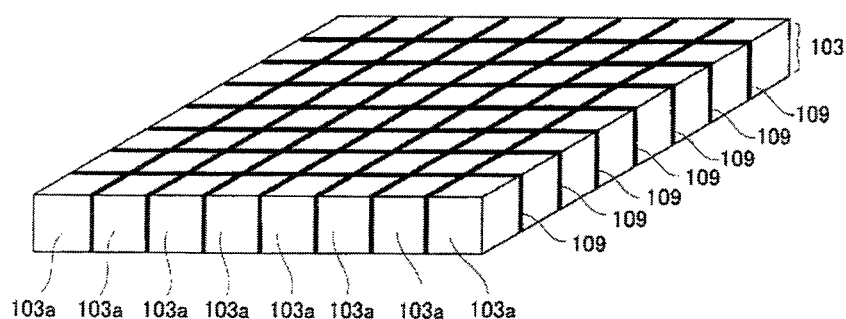
FIG. 18B is a perspective view showing a schematic structure of a light guide according to a conventional example.
Figure 18C:
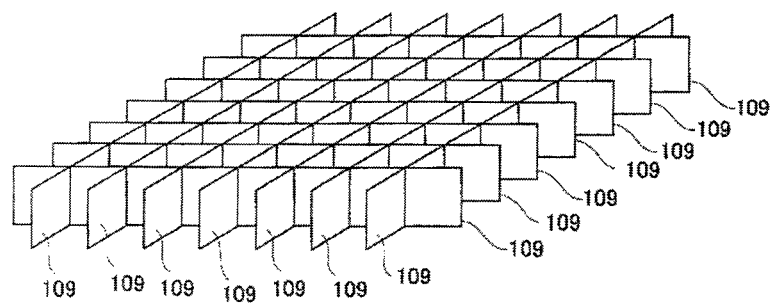
FIG. 18C is a perspective view showing a schematic structure of a reflector grating according to a conventional example.

In the case of a conventional radiation detector, as shown in FIG. 9A, the reflecting grating 34 is arranged so as to be perpendicular to each of the incident surface and the transmission surface of the light guide 5. In this case, as shown in FIG. 18A, in the light receiving element 17, the light receiving section 19 is not extended to the edge of the light receiving element 17. For this reason, the area S of the light receiving section 19 detecting the scintillator light L generated from the side edge portion of the scintillator block 3 is smaller than the area of the light receiving section 19 detecting the scintillator light generated from the center portion of the scintillator block 3. Therefore, the output of the electrical signal generated from the side edge portion of the scintillator block 3 due to the scintillator light is low.

Further, a part of the scintillator light generated from the side edge portion of the scintillator block 3 will be scattered or reflected by the outer wall of the scintillator block 3. Therefore, the scintillator light incident to the light receiving section 19 becomes more uneven. As a result, the gravity center calculation performed when converting the scintillator light into electrical signals becomes incomplete. Because of the low output and the incomplete gravity center calculation, the resolution of the radiation image based on the scintillator light at the side edge portion of the scintillator block 3 deteriorates. For the reasons set forth above, in the conventional radiation detector, it was difficult to attain high resolution required for preforming a DOI detection.

Figure 9B:
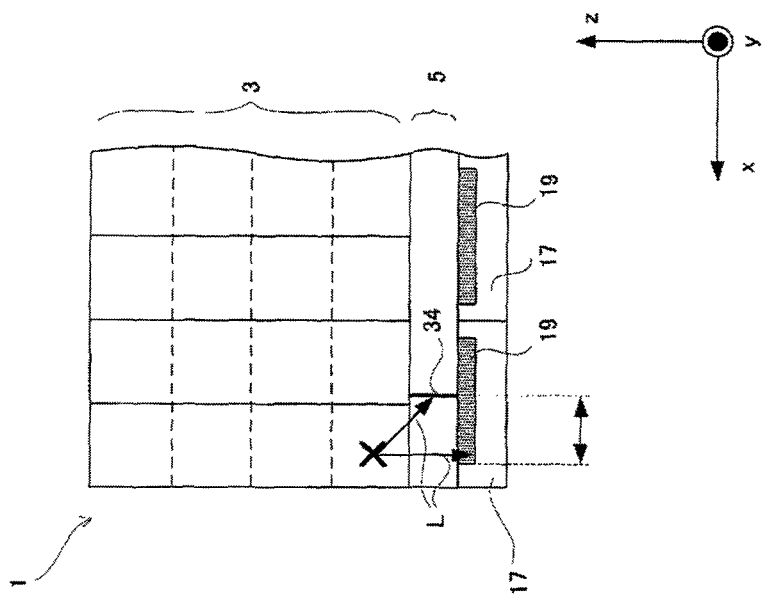

On the other hand, in the radiation detector of Embodiment 1, as shown in FIG. 9B, the reflector grating 11 is arranged so as to incline inwardly as it advances from the incident surface of the light guide 5 toward the transmission surface thereof. For this reason, the area S of the light receiving section 19 detecting the scintillator light L generated from the side edge portion of the scintillator block 3 becomes wider as compared with the conventional radiation detector. Therefore, the output of the electrical signal based on the scintillator light L generated at the side edge portion of the scintillator block 3 becomes stronger.

Further, in the radiation detector of Embodiment 1, since the area of the light receiving section 19 detecting the scintillator light generated from the side edge portion of the scintillator block 3 becomes wider, it becomes possible to perform more complete gravity center calculation for the scintillator light incident to the light receiving section 19. Accordingly, the resolution of radiation image information based on the scintillator light at the side edge portion can be further enhanced. As a result, in the radiation detector of Embodiment 1, it becomes possible to realize high resolution required for performing a DOI detection.

In the radiation detector according to Embodiment 1, the light guide 5 is partitioned by the reflector grating 11 into the center portion 23 and the side peripheral portions 25. The side peripheral portions 25 are coupled to the scintillator crystals positioned at the side edge portions of the scintillator crystal layer 3d so as to face the scintillator crystals. Thus, the scintillator light generated at the side edge portion of the scintillator block 3 can be more assuredly incident to the side peripheral portion 25. Since the side peripheral portion 25 of the light guide 5 is formed to have a tapered structure which becomes wider as it advances from the transmission surface of the light guide 5 toward the incident surface thereof, the scintillator light incident to the side peripheral portion 25 can be incident to the light receiving section 19 having a wider range.

On the other hand, since the center portion of the light guide 5 and the side peripheral portions 25 thereof are optically intercepted by the reflector grating 11, no scintillator light incident to the center portion 23 of the light guide 5 is entered into the side peripheral portion 25. Accordingly, in the radiation detector according to Embodiment 1, the resolution of the radiation image based on the scintillator right generated at the side edge portion of the scintillator block 3 can be further enhanced. For the reasons set forth above, the radiation detector of this embodiment can be applied to a TOF-PET apparatus, which in turn can realize a TOF-PET apparatus capable of performing a DOI detection.

Further, in the radiation detector according to Embodiment 1, in the resin curing step, the center portion 23 and the side peripheral portions 25 forming the light guide 5 can be easily integrally formed. Therefore, in the production step of the light guide 5, it is not required to perform a step of fabricating the center portion 23 and the side peripheral portions 25. Thus, a complicated fabrication step is simplified in the production step of the light guide, improving the production efficiency of the radiation detector, which in turn can provide a less expensive radiation detector.

Embodiment 2

Next, a radiation detector according to Embodiment 2 of the present invention will be described below with reference to the attached drawings. The general structure of the radiation detector according to Embodiment 2 is the same as the general structure of the radiation detector according to Embodiment 1. However, in Embodiment 1, the optical material forming the center portion 23 and that of the side peripheral portion 25 are the same, but in Embodiment 2, the center portion and the side peripheral portions are formed by different materials.

In the radiation detector according to Embodiment 2, as the optical material forming the center portion 23, an optical material higher in transparency than the optical material forming the side peripheral portion 25 is used. As examples of the optical material forming the center portion 23, for example, acrylic resin and silica glass can be exemplified. As examples of the optical material forming the side peripheral portion 25, for example, epoxy resin and silicon resin can be exemplified. In the description of Embodiment 2, as the optical material forming the center portion 23, acrylic resin is used, and as the optical material for forming the side peripheral portion 25, epoxy resin is used.

Figure 10A:
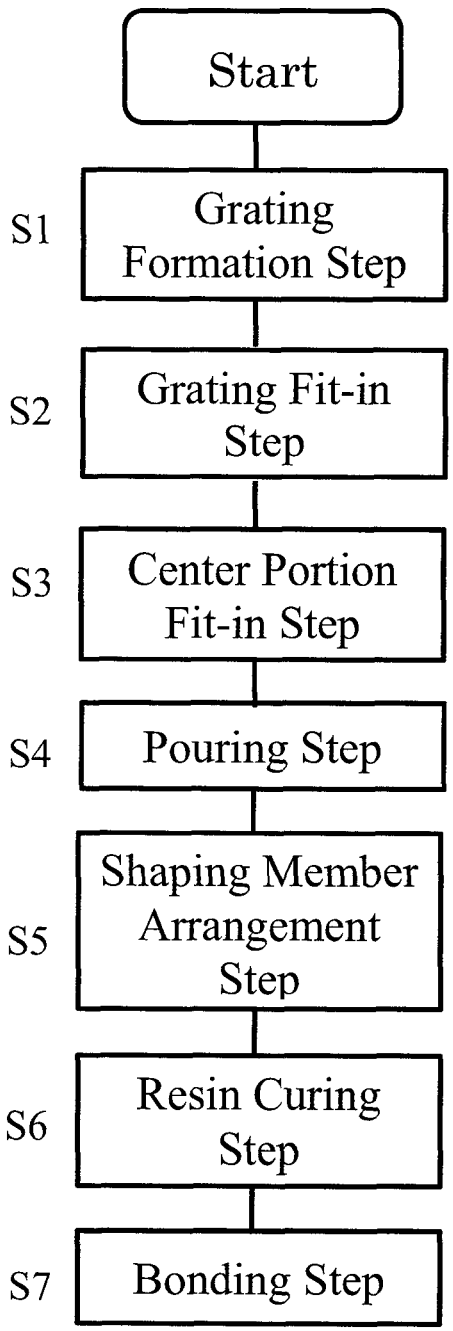
FIG. 10A is a flowchart illustrating a method for producing a radiation detector according to Embodiment 2.

Next, a method for producing a radiation detector according to Embodiment 2 will be described. The detail descriptions of steps common to the steps of producing the radiation detector of Embodiment 1 will be omitted. FIG. 10A is a flowchart according to Embodiment 2. The flowchart according to Embodiment 2 is common to the flowchart of the grating formation step of Step S1 and the flowchart of the grating fit-in step of Step S2.

Step 3 (Centering Portion Fit-in Step)

Figure 11A:
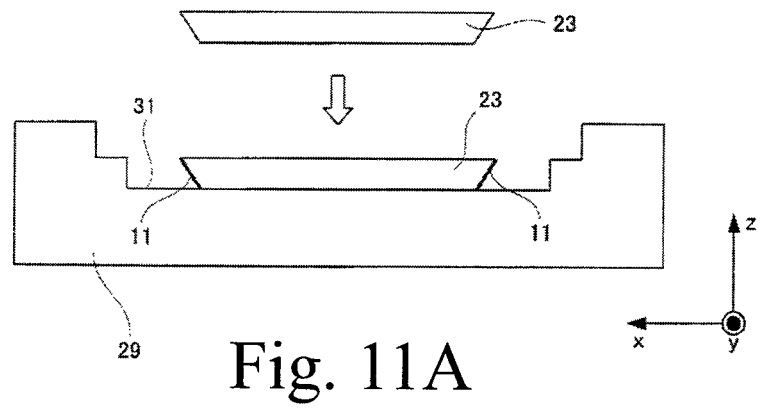
FIG. 11A is a vertical cross-sectional view illustrating a center portion fit-in step according to Embodiment 2.

In Embodiment 2, after fitting the reflector grating 11 in the mounting tub 31 as shown in FIG. 6B, a center portion fit-in step is initiated. That is, as shown in FIG. 11A, with respect to the reflector grating 11 fitted in the mounting tub 31, a center portion 23 previously formed into a square pyramid shape is fitted in the z-direction.

The height of the center portion 23 in the z-direction is approximately the same as the height of the reflector grating 11 in the z-direction. The shape of each side surface of the center portion 23 is formed such that each side surface of the center portion 23 comes into contact with the reflector grating 11 when the center portion 23 is fitted in the reflector grating 11. The bottom surface of the center portion 23 is optically polished into a planar state so as to come into contact with the surface of the mounting tub 31. In the same manner as in the bottom surface, the upper surface of the center portion is optically polished into a flat and smooth planar state. In Embodiment 2, as the optical material forming the center portion 23, a sold acrylic resin is used. However, in place of acrylic resin, silica glass may be used.

Step 4 (Pouring Step)

Figure 11B:
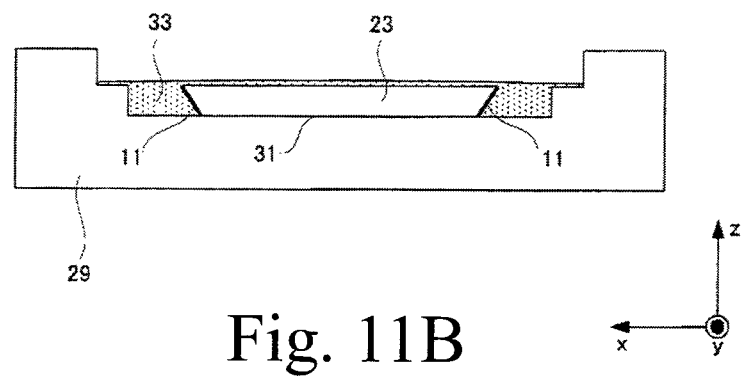
FIG. 11B is a vertical cross-sectional view illustrating a pouring step according to Embodiment 2.

After fitting the center portion 23 in the reflector grating 11, a pouring step is initiated. That is, as shown in FIG. 11B, thermosetting resin 33 is poured on the entire surface of the mounting tub 31. In the pouring step, as the thermosetting resin 33, a liquid resin before curing is used. For this reason, the liquid thermosetting resin 33 easily fills the mounting tub 31, so that the thermosetting resin 33 infiltrates the surface at which the reflector grating 11 and the center portion 23 are in contact with each other. The reflector grating 11 fitted in the mounting tub 31 and the center portion 23 are buried in the thermosetting resin 33 in the pouring step. After burying the reflector grating 11 and the center portion 23 in the thermosetting resin 33, sufficient vacuum degassing is performed against the thermosetting resin 33. The thermosetting resin 33 corresponds to the side peripheral portion 25 of the light guide 5 to be produced. In Embodiment 2, in the same manner as in Embodiment 1, as the thermosetting resin 33, epoxy resin is used.

Step 5 (Shaping Member Arrangement Step)

Figure 11C:
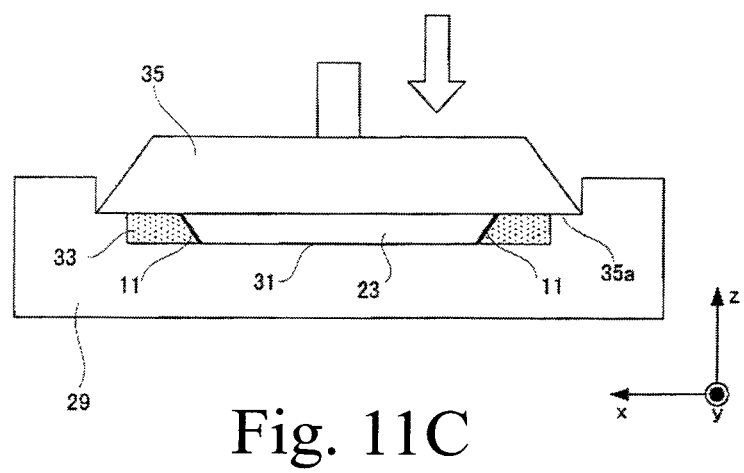
FIG. 11C is a vertical cross-sectional view illustrating a shaping member arrangement step according to Embodiment 2.

After pouring the thermosetting resin 33 in the mounting tub 31, in the same manner as in Embodiment 1, a shaping member 35 is arranged so as to cover the mounting tub 31 of the molding frame 29. By arranging the shaping member 35, as shown in FIG. 11C, the liquid surface of the thermosetting resin 33 and the upper surface of the center portion 23 are covered by the bottom surface 35a over the entire surface. As described above, the upper surface of the center portion 23 is a smooth and flat surface, and the height of the center portion 23 in the z-direction is approximately the same as the height of the mounting tub 31 in the z-direction.

For this reason, the bottom surface 35a of the shaping member 35 comes into contact with the upper surface of the center portion 23.

Step 6 (Resin Curing Step)

After arranging the shaping member 35 above the mounting tub 31, a resin curing step is initiated. That is, in a state in which the shaping member 35 is arranged, the molding frame 29 is put in an oven kept at a predetermined temperature to cure the thermosetting resin 33. When the thermosetting resin 33 is cured, the resin becomes a solid resin high in transparency.

As described above, in the pouring step of Step S4, the thermosetting resin 33 is poured on the entire surface of the mounting tub 31, so that the thermosetting resin 33 infiltrates the surfaces at which the reflector grating 11 and the center portion 23 are in contact with each other. As a result, curing of the thermosetting resin 33 causes bonding of the center portion 23 and the reflector grating 11. Thus, when the thermosetting resin 33 is cured, a light guide 5 in which the thermosetting resin 33 and the center portion 23 are integrated via the reflector grating 11 is formed. In other words, in Embodiment 2, the center portion 23 formed by the center portion 23 and the side peripheral portions 25 constituted by the thermosetting resin 33 are integrated, so that the light guide 5 is formed.

After forming the light guide 5, in the same manner as in Embodiment 1, the shaping member 35 is lifted up in the z-direction or in a direction departing from the molding frame 29. The formed light guide 5 is pulled out from the mounting tub 31 together with the shaping member 35 to be detached from the molding frame 29. After the detachment, both of the surface of the light guide 5 which was in contact with the shaping member and the surface of the light guide 5 which was in contact with the mounting tub 31 may be polished as needed. By detaching and polishing the light guide 5, the resin curing step is terminated, and a series of steps for producing the light guide 5 is completed.

Step 7 (Bonding Step)

After completion of the resin curing step, in the same manner as in Embodiment 1, a bonding step is initiated. That is, as shown in FIG. 8A, the incident surface 5a of the produced light guide 5 and the scintillator crystal layer 3d constituting the scintillator block 3 are brought into optical coupling with each other via optical adhesive. Further, the transmission surface 5b of the light guide 5 and the solid state light detector 7 are brought into optical coupling via optical adhesive. When optically coupling the light guide 5, the scintillator block 3 and the solid state light detector 7, the entire steps according to Embodiment 2 are completed.

As described above, according to the method for producing the radiation detector of Embodiment 2, it becomes possible to produce a radiation detector which has attained high resolution even at the side edge portion of the scintillator block at lower cost. Acrylic resin and silica glass are extremely excellent in transparency. Therefore, by using acrylic resin or silica glass as the optical material forming the light guide, attenuation of the scintillator light can be minimized, which can increase the output of the radiation detector.

However, in cases where a light guide is partitioned into a number of blocks by a reflector grating, in a conventional radiation detector, there are following drawbacks. That is, if all of the blocks are made of acrylic resin or silica glass, the production cost of the radiation detector increases because of the following reasons. Since the material is solid, it is required to polish each block small in area and fabricate the polished blocks and the reflector grating by bringing together. This makes the production operation complex and difficult.

On the other hand, in the case of epoxy resin or silicon resin, even in cases where the light guide is partitioned into a number of blocks by curing liquid resin by heating, the light guide can be integrally formed. This eliminates complicated fabrication steps, enabling production of a radiation detector at low cost by simple steps. However, epoxy resin and silicon resin are low in light transmission property as compared with acrylic resin or silica glass. For this reason, if all of the blocks are made of epoxy resin or silicon resin, the output of a conventional radiation detector decreases.

In the radiation detector according to Embodiment 2, the center portion and the side peripheral portions of the light guide partitioned by the reflector grating are made of different optical materials. In detail, the center portion occupying a larger area is made of acrylic resin or silica glass, while the side peripheral portions formed by a number of blocks are made of epoxy resin or silicon resin. The center portion occupying a large area is made of a material excellent in optical transparency, and therefore the attenuation of light can be minimized. As a result, the output of the radiation detector is maintained in a high state, which makes it possible to obtain a radiation image high in resolution.

On the other hand, since the side peripheral portion is made of resin which cures by heating, even in cases where the side peripheral portion is partitioned into a number of blocks, the side peripheral portion can be integrally formed by curing liquid resin by heating. Further, in the resin curing step, the center portion and the side peripheral portion are adhered via the reflector grating by curing of the thermosetting resin. Therefore, in the production step of the light guide, it is not required to perform complicated fabrication steps. Further, since the center portion occupies a large area, the surface of the member made of, e.g., acrylic resin forming the center portion can be easily processed or polished. Thus, by the production method of Embodiment 2, a radiation detector can be produced at low cost by simple steps.

Further, in the same manner as in Embodiment 1, in the radiation detector according to Embodiment 2, the side peripheral portions 25 are coupled to the scintillator crystals of the scintillator crystal layer 3d positioned at the side edge portions so as to face the scintillator crystals. That is, since the area of the side peripheral portion in the light guide is narrower as compared with the center portion, even in cases where the side peripheral portion is made of an optical material relatively low in optical transparency, the influence on the output of the radiation detector is small. Accordingly, by the production method of Embodiment 2, it becomes possible to realize a radiation detector capable of being produced at low cost and capable of obtaining a radiation image high in resolution.

Embodiment 3

Next, a method for producing a radiation detector according to Embodiment 3 will be described. The general structure of the radiation detector according to Embodiment 3 is the same as the general structure of the radiation detector according to Embodiment 2. That is, the light guide 5 is partitioned by the reflector grating 11 into a center portion 23 made of acrylic resin and side peripheral portions 25 made of epoxy resin. The center portion 23 may be made of silica glass. Further, the side peripheral portions 25 may be made of silicon resin.

Figure 10B:
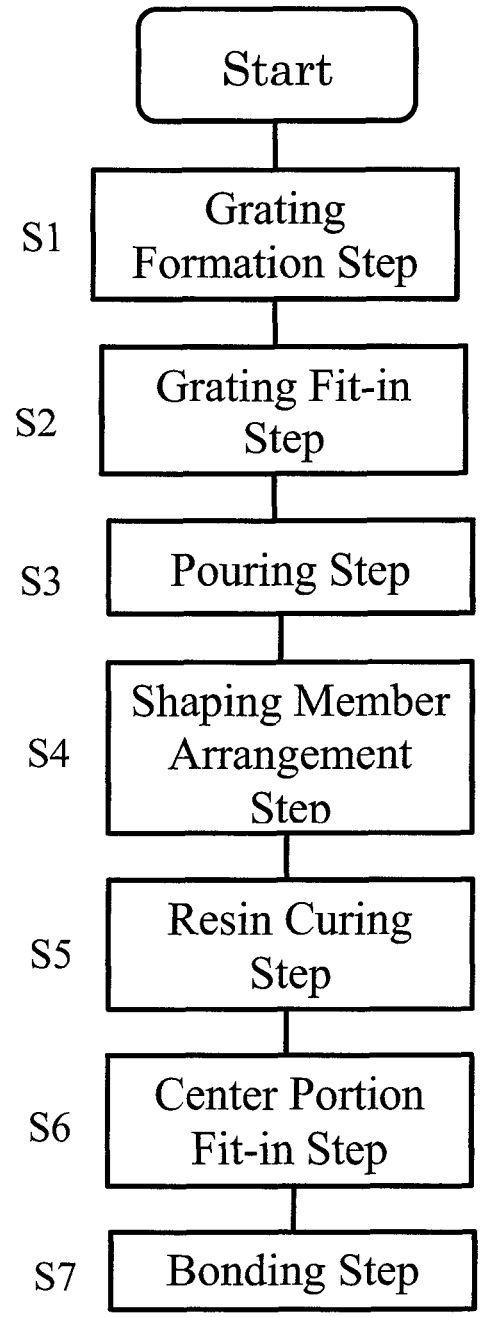
FIG. 10B is a flowchart illustrating a method for producing a radiation detector according to Embodiment 3.

Next, the method for producing a radiation detector according to Embodiment 3 will be described. The detail descriptions of steps common to the steps of the aforementioned Embodiments will be omitted. FIG. 10B is a flowchart describing the method for producing the radiation detector according to Embodiment 3. The flowchart according to Embodiment 3 is common to the flowcharts of Embodiment 1 and Embodiment 2 about the grating formation step of Step S1.

Step 2 (Grating Fit-in Step)

Figure 12:
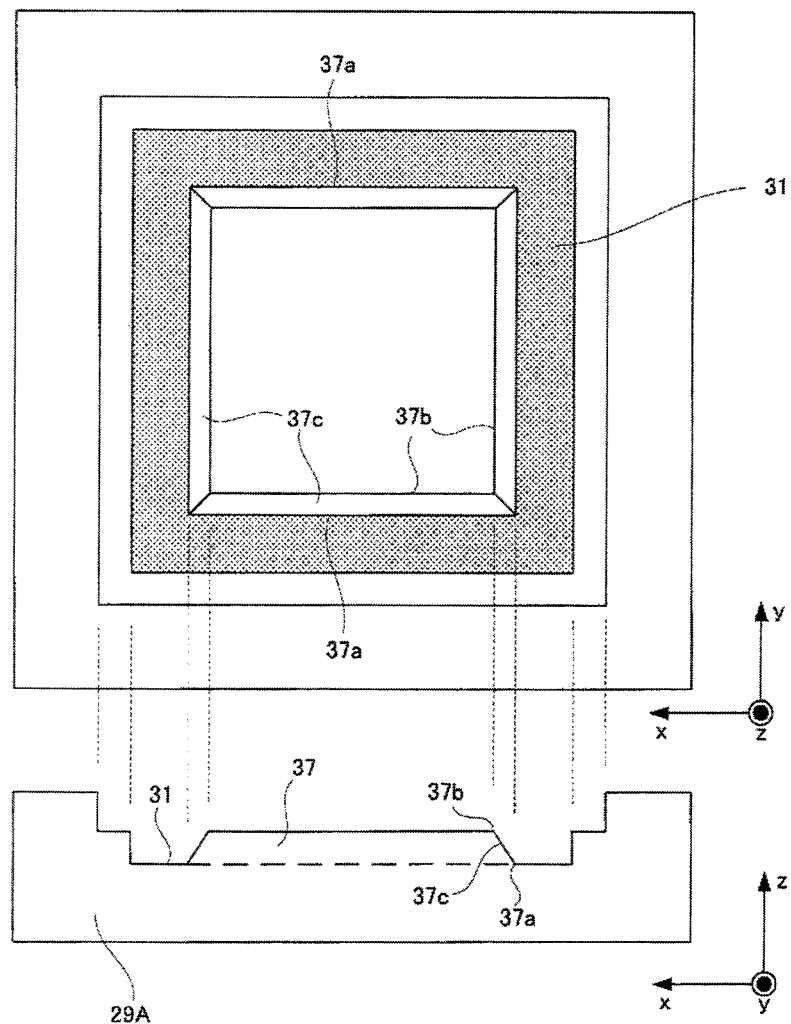
FIG. 12 is a vertical cross-sectional view illustrating a structure of a molding frame according to Embodiment 3.

After forming the reflector grating 11, a grating fit-in step is initiated. The structure of a molding frame 29A used in Embodiment 3 will be described. The molding frame 29A is, as shown in FIG. 12, provided with a mounting tub 31 opening upward in the z-direction. At the center of the mounting tub 31, a convex portion 37 is provided. The convex portion 37 includes bottom sides 37a, upper sides 37b and side surfaces 37c, and the bottom sides 37a are in contact with the mounting tub 31.

The mounting tub 31 is formed to have a rectangular shape as seen in any one of directions, x-direction, y-direction, and z-direction. Dimensions of the mounting tub 31 in the x-direction, y-direction, and z-direction are set to be approximately the same as dimensions of the light guide 5 in the x-direction, y-direction, and z-direction, respectively.

The convex portion 37 has a tapered structure tapering toward the x-direction. That is, it is tapered from the bottom side 37a toward the upper side 37b. The dimension of the bottom side 37a in the x-direction and that in the y-direction are approximately the same as the dimension of the center portion 23 of the incident surface in the x-direction and that in the y-direction, respectively. The dimension of the upper side 37b in the x-direction and that in the y-direction are approximately the same as the dimension of the center portion 23 of the transmission surface in the x-direction and that in the y-direction, respectively. Therefore, the dimension of the side surface 37c is approximately the same as the dimension of the side surface of the center portion 23. Further, the height of the convex portion 37 in the z-direction is approximately the same as the height of the center portion 23 in the z-direction. That is, the dimensions of the convex portion 37 are approximately the same as the dimensions of the center portion 23. The convex portion 37 corresponds to the tapered portion of the present invention.

Figure 13A:
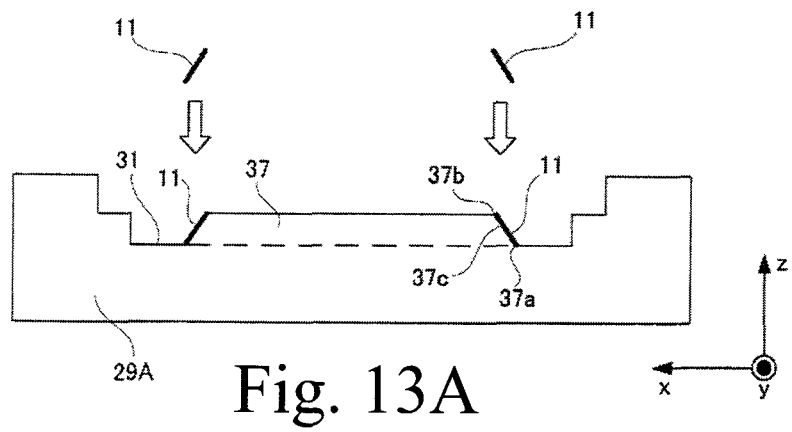
FIG. 13A is a vertical cross-sectional view illustrating a grating fit-in step according to Embodiment 3.

In the grating fit-in step, as shown in FIG. 13A, the reflector grating 11 is fitted in the mounting tub 31 in the z-direction so as to cover the side surfaces 37c of the convex portion 37. When the reflector grating 11 is fitted in the mounting tub 31, the side edge portions of the reflector grating 11 come into contact with the side end faces of the mounting tub 31. As described above, since the dimensions of the convex portion 37 are approximately the same as those of the center portion 23, the inner surfaces of the fitted reflector grating 11 come into contact with the side surfaces 37c.

Step 3 (Pouring Step)

Figure 13B:
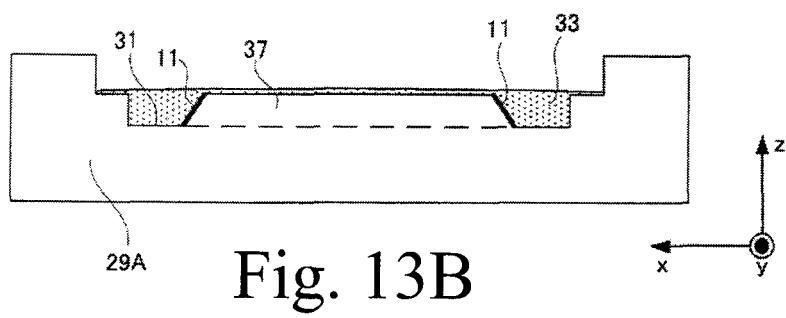
FIG. 13B is a vertical cross-sectional view illustrating a pouring step according to Embodiment 3.

After fitting the reflector grating 11 in the mounting tub 31, a pouring step is initiated. That is, as shown in FIG. 13B, liquid thermosetting resin 33 is poured on the entire surface of the mounting tub 31. The liquid thermosetting resin 33 easily fills the mounting tub 31, so that the reflector grating 11 is buried in the thermosetting resin 33. After the reflector grating 11 is buried in the thermosetting resin 33, sufficient vacuum degassing is performed against the thermosetting resin 33. The thermosetting resin 33 corresponds to the side peripheral portion 25 in the light guide 5 to be produced. In Embodiment 3, in the same manner as the aforementioned other Embodiments, as the thermosetting resin 33, epoxy resin is used.

Step 4 (Shaping Member Arrangement Step)

Figure 13C:
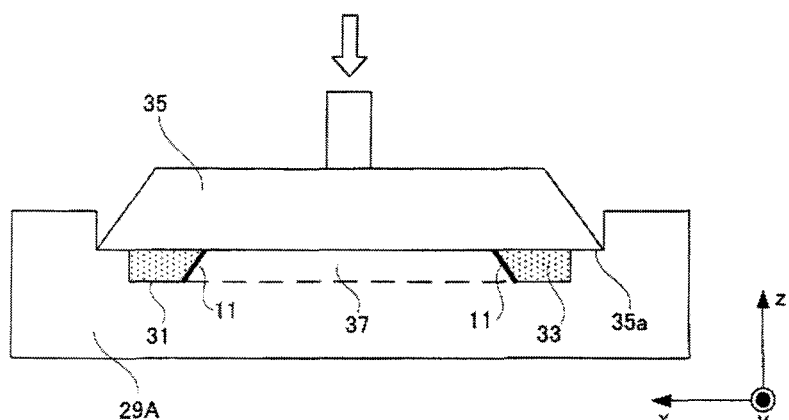
FIG. 13C is a vertical cross-sectional view illustrating a shaping member arrangement step according to Embodiment 3.

After pouring the thermosetting resin 33 in the mounting tub 31, in the same manner as in Embodiment 1, a shaping member 35 is arranged so as to cover the mounting tub 31 of the molding frame 29A. By arranging the shaping member 35, as shown in FIG. 13C, the liquid surface of the thermosetting resin 33 and the convex portion 37 are covered by the bottom surface 35a over the entire surface.

Step 5 (Resin Curing Step)

After arranging the shaping member 35 in the mounting tub 31, a resin curing step is initiated. That is, in a state in which the shaping member 35 is arranged, the molding frame 29 is put in an oven kept at a predetermined temperature to cure the thermosetting resin 33. When the thermosetting resin 33 is cured, the resin becomes solid resin high in transparency. Curing of the thermosetting resin 33 causes integral bonding of the thermosetting resin 33 and the reflector grating 11. That is, in the resin curing step, a complex assembly 39 in which the side peripheral portions 25 formed by the thermosetting resin 33 and the reflector grating 11 are integrated is formed.

Figure 14A:
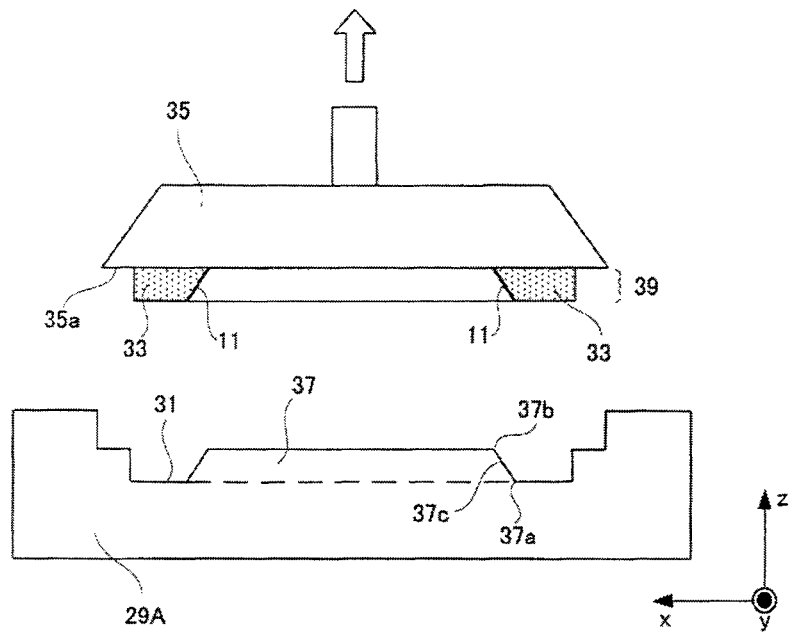
FIG. 14A is a vertical cross-sectional view illustrating a resin curing step according to Embodiment 3.

After forming the complex assembly 41, as shown in FIG. 14A, the shaping member 35 is lifted up in the z-direction or in a direction departing from the molding frame 29A. The formed complex assembly 39 is pulled out from the mounting tub 31 together with the shaping member 35 to be detached from the molding frame 29A.

Step 6 (Center Portion Fit-in Step)

Figure 14B:
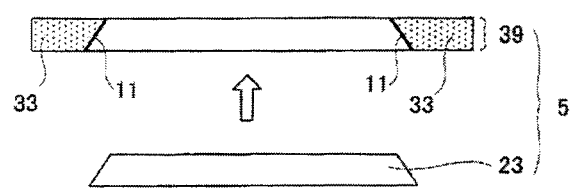
FIG. 14B is a vertical cross-sectional view illustrating a center portion fit-in step according to Embodiment 3.

After detaching the complex assembly 39 from the molding frame 29A, a center portion fit-in step is initiated. That is, as shown in FIG. 14B, the center portion 23 is fitted in the complex assembly 39 in the direction shown by an arrow to bond the center portion 23 and the reflector grating 11 via optical adhesive. The center portion fit-in step is terminated by bonding the center portion 23 and the reflector grating 11, and a series of steps for producing the light guide 5 are completed.

Step 7 (Bonding Step)

After completion of the resin curing step, in the same manner as in Embodiment 1 and Embodiment 2, a bonding step is initiated. That is, as shown in FIG. 8A, the incident surface 5a of the produced light guide 5 and the scintillator crystal layer 3d forming the scintillator block 3 are brought into optical coupling via optical adhesive. Further, the transmission surface 5b of the light guide 5 and the solid state light detector 7 are also brought into optical coupling via optical adhesive. When optically coupling the light guide 5, the scintillator block 3 and the solid state light detector 7, the entire steps according to Embodiment 3 are completed.

As described above, according to the method for producing the radiation detector of Embodiment 3, it becomes possible to produce a radiation detector which has attained high in resolution even at the side edge portion of the scintillator block at lower cost. That is, in the same manner as in Embodiment 2, since the center portion occupying a large area is formed by acrylic resin excellent in transparency, the output of the radiation detector can be increased. Further, since the side peripheral portions formed by a number of blocks are formed by, e.g., epoxy resin which cures by heating, it becomes possible to produce a radiation detector by simple steps without performing complex steps.

Further, according to the method for producing a radiation detector of Embodiment 3, the center portion fit-in step is performed after the resin curing step. That is, different from Embodiment 2, in Embodiment 3, through a series of production steps, the incident surface of the center portion and the thermosetting resin are not brought into contact with each other. Accordingly, the incident surface of the center portion is kept in an optically polished state, and therefore the radiation detector according to Embodiment 3 can exert a more preferable optical performance.

The present invention is not limited to the aforementioned embodiments, and can be modified as described below.

(1) In each Embodiment described above, the scintillator block 3 is formed by stacking four scintillator crystal layers in the z-direction, each scintillator crystal layer being formed by arranging scintillator crystals in an 8 (eight)×8 (eight) matrix in the x-direction and y-direction, but not limited to the structure. That is, the number of scintillator crystals in each direction is not specifically limited.

(2) In each Embodiment described above, the light receiving element array 9 is structured such that the light receiving elements 11 are arranged in a 4×4 matrix in the x-direction and y-direction, but not limited to it. That is, the number of light receiving elements 11 in each direction is not specifically limited.

(3) In each Embodiments described above, a SiPM element is used as the light receiving element array 11, but not limited to it. That is, an APD (Avalanche Photo Diode) element or a photomultiplier tub (PMT) may be used. Especially, a SiPM element or an APD element is less affected by a magnetic field generated from a magnetic resonance tomograph (MR apparatus). For this reason, the radiation detector according to the present invention can be applied to a PET-MR.

(4) In each Embodiment described above, it may be configured such that each reflection member constituting the reflector grating 11 is arranged perpendicular to the incident surface of the light guide 5.

Figure 15:
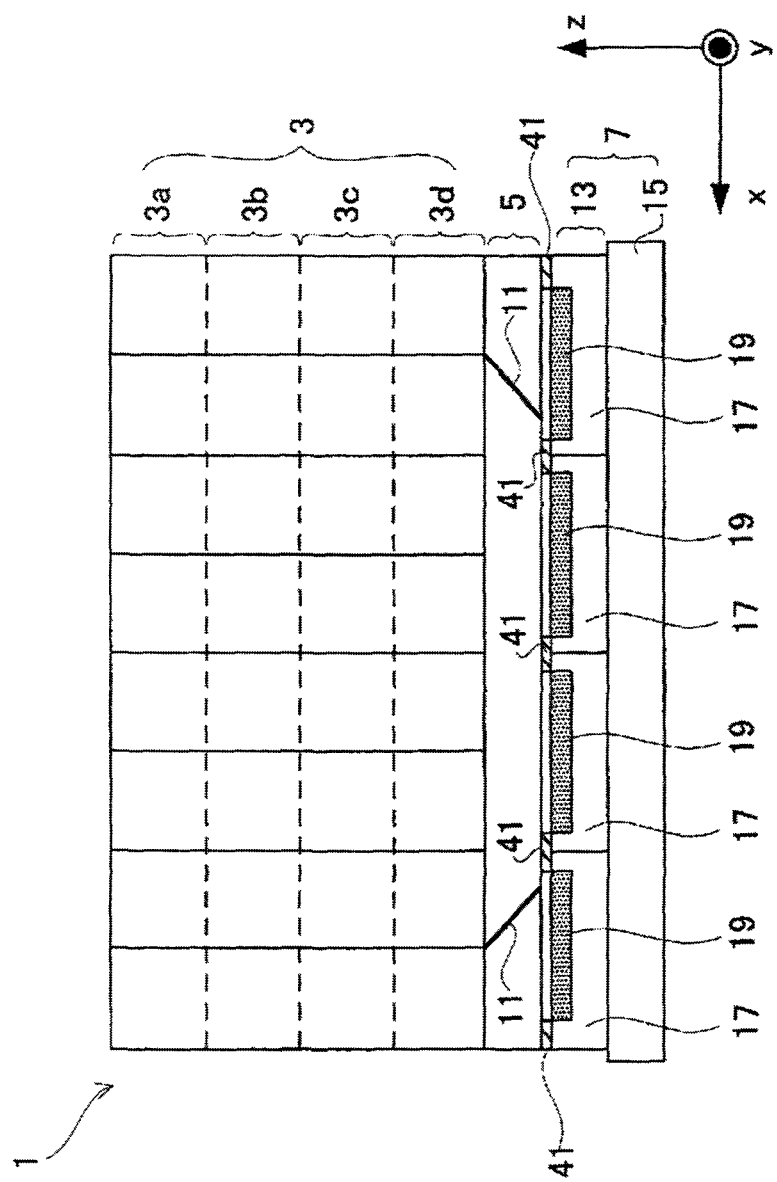
FIG. 15 is a vertical cross-sectional view illustrating a schematic structure of a radiation detector according to a modified embodiment.
Figure 16:
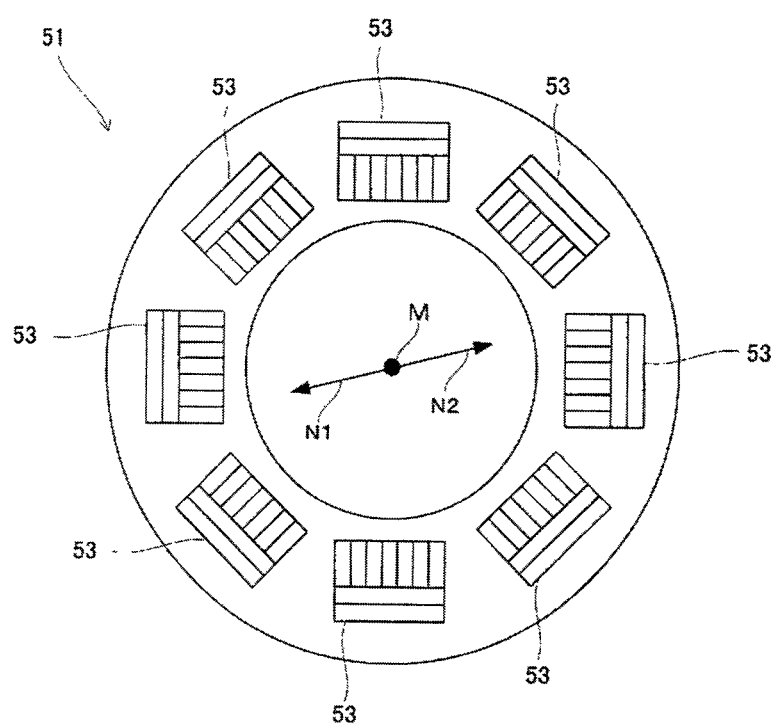
FIG. 16 is a vertical cross-sectional view showing a schematic structure of a PET apparatus according to a conventional example.
Figure 17:
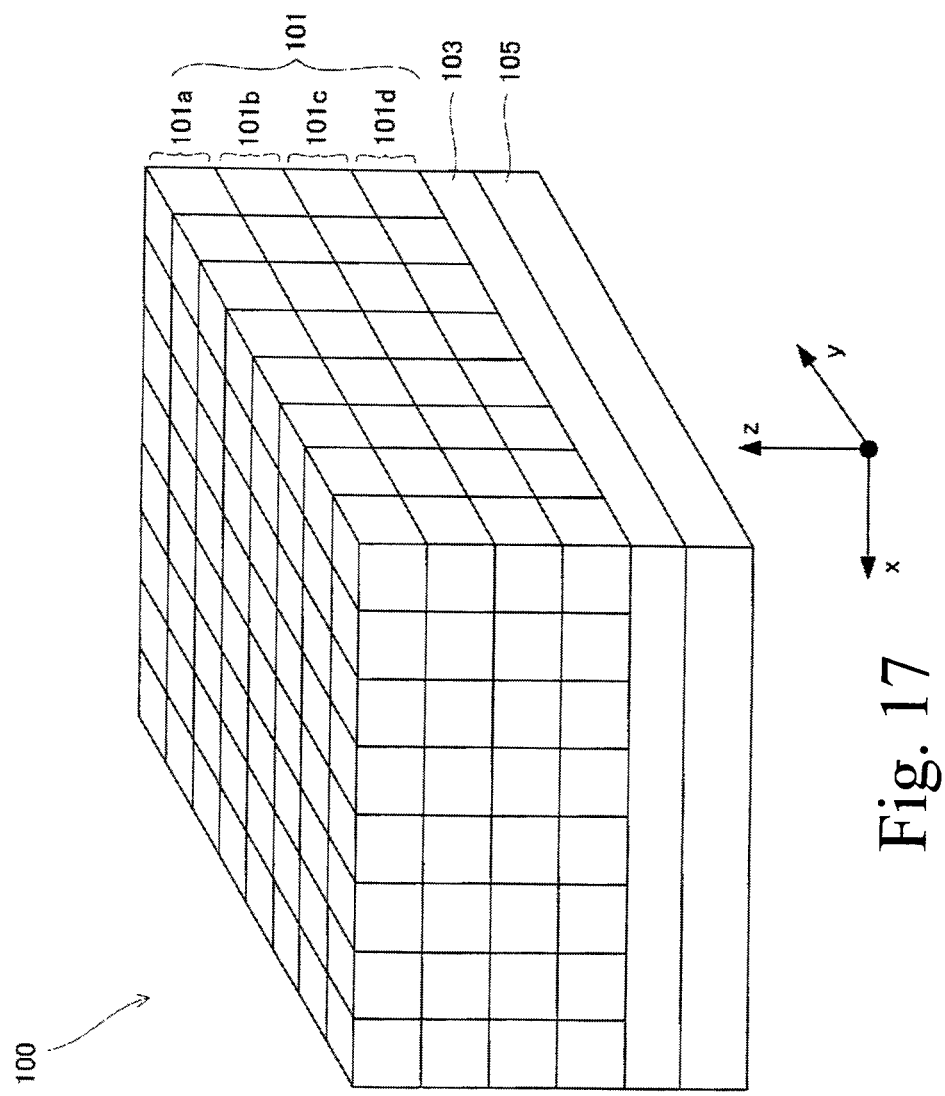
FIG. 17 is a perspective view illustrating a schematic structure of a radiation detector according to a conventional example.

(5) In each Embodiment described above, as shown in FIG. 15, it may be configured such that the surface of the light receiving element 17 which is not provided with the light receiving section 19 is covered by a reflection mask 41. The scintillator light toward the light receiving element 17 other than the light receiving sections will be reflected and finally incident to the light receiving sections 19. Therefore, it is possible to effectively convert the scintillator light into electric signals.

DESCRIPTION OF THE REFERENCE NUMERALS

1 . . . radiation detector
3 . . . scintillator block
5 . . . light guide
7 . . . solid state light detector
11 . . . reflector grating (reflector)
17 . . . light receiving element
19 . . . light receiving section
23 . . . center portion
25 . . . side peripheral portion
29 . . . molding frame
31 . . . mounting tub
33 . . . curing resin
35 . . . shaping member
37 . . . convex portion

What is claimed is:

1. A radiation detector comprising:
   a scintillator block constituted by block-shaped scintillator crystals arranged three-dimensionally, the scintillator block being configured to detect incident radiation and emit light;
   a light guide optically coupled to the scintillator block, the light guide being configured to transmit the light emitted from the scintillator;
   a solid state light detector optically coupled to the light guide, the solid state light detector being configured to convert the light transmitted from the light guide into electrical signals; and
   a reflector embedded in the light guide, the reflector being configured to reflect light,
   wherein the light guide is structured so as to be divided into a center portion and side peripheral portions by the reflector, and
   wherein the light guide and the scintillator block are coupled such that first surfaces of the side peripheral portions face surfaces of the scintillator crystals positioned at side edge portions of the scintillator block among the scintillator crystals constituting the scintillator block and second surfaces of the side peripheral portions, opposite to the first surfaces of the side peripheral portions, face a surface of the solid state light detector,
   wherein at least some of the side peripheral portions of the light guide are tapered, each having a corresponding second surface larger than a corresponding first surface.

2. The radiation detector as recited in claim 1, wherein the center portion has a shape having an area decreasing as it advances from a surface of the center portion coupled to the scintillator block toward a surface of the center portion coupled to the solid state light detector.

3. The radiation detector as recited in claim 1,
   wherein the center portion and the side peripheral portions are constituted by the same optical material, and
   wherein the center portion, the reflector, and the side peripheral portions are bonded with each other by curing of the optical material.

4. The radiation detector as recited in claim 3, wherein the optical material is any one of epoxy resin, silicon resin, and acrylic resin.

5. The radiation detector as recited in claim 1,
   wherein the center portion and the side peripheral portions are constituted by different optical materials,
   wherein the optical material constituting the center portion is higher in transparency than the optical material constituting the side peripheral portions, and
   wherein the side peripheral portions and the reflector are bonded by curing of the optical material constituting the side peripheral portions.

6. The radiation detector as recited in claim 5, wherein the optical material constituting the center portion is acrylic resin or silica glass.

7. The radiation detector as recited in claim 5, wherein the optical material constituting the side peripheral portions is epoxy resin or silicon resin.

8. The radiation detector as recited in claim 1,
   wherein the solid state light detector comprises an array of light receiving elements, each light receiving element comprising a silicon photo multiplier (SiPM) or an avalanche photo diode (APD), and
   wherein the scintillator crystals positioned at side edge portions of the scintillator block are in optical communication with a surface area of outermost ones of the light receiving elements that is larger than any other surface area the outermost ones of the light receiving elements that are in optical communication with any other scintillator crystals of the scintillator block.

9. The radiation detector as recited in claim 1,
wherein the solid state light detector comprises an array of light receiving elements, each light receiving element comprising a silicon photo multiplier (SiPM) or an avalanche photo diode (APD), and
wherein the reflector extends to and terminates adjacent to inner facing edges of outermost ones of the light receiving elements.

10. The radiation detector as recited in claim 1, wherein the center portion is formed of a solid undivided optical material.

11. A method for producing a radiation detector, the method comprising:
a grating formation step in which a reflector grating is formed by combing light reflective members;
a grating fit-in step in which after the grating formation step, the reflector grating is fit in a mounting tub provided in a molding frame;
a center portion fit-in step in which after the grating fit-in step, an optical material is fitted inside the reflector grating;
a pouring step in which after the center portion fit-in step, curing resin is poured in the mounting tub so that the reflector grating is covered by the curing resin;
a resin curing step in which after the pouring step, a light guide in which the reflector grating is sealed is produced by curing the curing resin; and
a bonding step in which after the resin curing step, the produced light guide is optically coupled to each of a scintillator block and a solid state light detector,
wherein in the bonding step, the scintillator block and the light guide are coupled such that surfaces of side peripheral portions of the light guide face surfaces of scintillator crystals positioned at a side edge portion of the scintillator block among scintillator crystals constituting the scintillator block.

12. The method for producing a radiation detector as recited in claim 11, wherein in the grating fit-in step, the light reflective members constituting the reflector grating are fit in in a state in which each light reflective member is inclined inwardly toward a bottom surface of the mounting tub so that a lower side position of each light reflective member is positioned at a center side of the grating than an upper side position of each light reflective member.

13. The method for producing a radiation detector as recited in claim 11, wherein the curing resin is any one of epoxy resin, silicon resin, and acrylic resin.

14. The method for producing a radiation detector as recited in claim 11,
wherein the solid state light detector comprises an array of light receiving elements, each light receiving element comprising a silicon photo multiplier (SiPM) or an avalanche photo diode (APD), and
wherein the reflector is positioned so that outer light receiving elements located at an edge of the array of light receiving elements are in optical communication with the scintillator crystals positioned at side edge portions of the scintillator block via optical exposure of first surface area of the outer light receiving elements to the scintillator crystals positioned at side edge portions of the scintillator block, and
wherein the reflector is positioned so that the first surface area of the outer light receiving elements is greater than any other surface area of the outer light receiving elements that may be exposed to scintillator crystals not positioned at side edge portions of the scintillator block.

15. The method as recited in claim 11, wherein, in the center portion fit-in step, the optical material fitted inside the reflector grating is fitted inside the reflector grating as a solid undivided optical material.

16. The method as recited in claim 11,
wherein the solid state light detector comprises an array of light receiving elements, each light receiving element comprising a silicon photo multiplier (SiPM) or an avalanche photo diode (APD), and
wherein the reflector extends to and terminates adjacent to inner facing edges of outermost ones of the light receiving elements.

17. The method as recited in claim 11, wherein at least some of the side peripheral portions of the light guide are tapered, each having a corresponding surface facing the solid state light detector that is larger than a corresponding opposite surface facing the scintillator block.

18. A method for producing a radiation detector, the method comprising:
a grating formation step in which a reflector grating is formed by combining light reflective members;
a grating fit-in step in which after the grating formation step, the reflector grating is fit in a mounting tub provided in a molding frame;
a center portion fit-in step in which after the grating fit-in step, an optical material is fitted inside the reflector grating;
a pouring step in which after the center portion fit-in step, curing resin is poured in the mounting tub so that the reflector grating and the optical material are buried in the curing resin;
a resin curing step in which after the pouring step, the curing resin is cured to form a light guide in which a center portion, the reflector grating, and side peripheral portions are bonded; and
a bonding step in which after the resin curing step, the formed light guide is optically coupled to each of a scintillator block and a solid state light detector,
wherein the optical material is higher in transparency than the curing resin, and
wherein in the bonding step, the scintillator block and the light guide are optically coupled so that surfaces of the scintillator crystals positioned at a side edge portion of the scintillator block among the scintillator crystals constituting the scintillator block and surfaces of the side peripheral portions constituting the light guide face each other.

19. The method for producing a radiation detector as recited in claim 18, wherein in the grating fit-in step, the light reflective members constituting the reflector grating are fit in in a state in which each light reflective member is inclined inwardly toward a bottom surface of the mounting tub so that a lower side position of each light reflective member is positioned at a center side of the grating than an upper side position of each light reflective member.

20. The method for producing a radiation detector as recited in claim 18, wherein the optical material is acrylic resin or silica glass.

21. The method for producing a radiation detector as recited in claim 18, wherein the curing resin is epoxy resin or silicon resin.

22. A method for producing a radiation detector, the method comprising:

a grating formation step in which a reflector grating is formed by combining light reflective members;

a grating fit-in step in which after the grating formation step, the reflector grating is fit in a mounting tub provided in a molding frame;

a pouring step in which after the grating fit-in step, curing resin is poured in the mounting tub so that the reflector grating is buried in the curing resin;

a resin curing step in which after the pouring step, the curing resin is cured to form a temporary assembly in which the reflector grating and side peripheral portions are bonded;

a center portion fit-in step in which after the resin curing step, an optical material higher in transparency than the curing resin is fitted in and bonded to the concave portion formed in a center of the temporary assembly to form a light guide; and a bonding step in which after the center portion fit-in step, the formed light guide is optically coupled to each of the formed scintillator block and a solid state light detector, wherein in the grating fit-in step, the reflector grating is fitted so as to cover a side wall of a convex portion provided at a mounting tub, and wherein in the bonding step, the scintillator block and the light guide are optically coupled so that surfaces of the scintillator crystals positioned at a side edge portion of the scintillator block among the scintillator crystals constituting the scintillator block and surfaces of the side peripheral portions constituting the light guide face each other.

23. The method for producing a radiation detector as recited in claim 22, wherein in the grating fit-in step, the convex portion provided at the mounting tub has a tapered shape.

* * * * *